(12) United States Patent
Skovira

(10) Patent No.: US 8,763,834 B2
(45) Date of Patent: Jul. 1, 2014

(54) MODULAR ENCLOSURE

(76) Inventor: Gregory Skovira, Malvern, PA (US)

( * ) Notice: Subject to any disclaimer, the term of this patent is extended or adjusted under 35 U.S.C. 154(b) by 315 days.

(21) Appl. No.: 12/868,274

(22) Filed: Aug. 25, 2010

(65) Prior Publication Data

US 2011/0049140 A1 Mar. 3, 2011

Related U.S. Application Data

(60) Provisional application No. 61/237,816, filed on Aug. 28, 2009.

(51) Int. Cl.
*B65D 25/04* (2006.01)

(52) U.S. Cl.
USPC ....... 220/23.4; 220/4.03; 220/4.27; 220/4.28; 220/4.33

(58) Field of Classification Search
USPC .............. 220/669, 4.33, 4.27, 4.03, 1.5, 23.4, 220/4.28, 4.26; 211/188, 194
See application file for complete search history.

(56) References Cited

U.S. PATENT DOCUMENTS

| | | | | | |
|---|---|---|---|---|---|
| 3,044,656 | A | * | 7/1962 | Combs et al. | 220/4.28 |
| 3,645,596 | A | * | 2/1972 | Russell-French | 312/258 |
| 4,558,797 | A | * | 12/1985 | Mitchell | 220/668 |
| 4,747,505 | A | * | 5/1988 | Hansen | 220/4.28 |
| 5,755,062 | A | * | 5/1998 | Slater | 52/79.1 |

* cited by examiner

*Primary Examiner* — Stephen Castellano
(74) *Attorney, Agent, or Firm* — Donald J. Ranft; Collen IP

(57) ABSTRACT

A modular enclosure that can be used as a stand-alone unit or can be ganged together in a multiple unit configuration. The enclosure system consisting of a base frame and front door with open sides which can accommodate various side covers or attachments all using the same common mounting. The common mounting used to attach the various covers or attachments provides a unique design for attaching and sealing the side covers or attachments while providing a water-tight and dust tight seal between the interior of the enclosure and the exterior of the enclosure. A variety of attachments are available which give the modular enclosure flexibility to be configured in a wide variety of ways.

19 Claims, 36 Drawing Sheets

Clearance Hole for Door Latch (4)

AUXILIARY FRONT GASKET
ONE-SIDE ADHESIVE

JOINER FRAME GASKET
ONE-SIDE ADHESIVE

DOOR GASKET
ONE-SIDE ADHESIVE

Cross Section of Frame (1) and Sidecover (8)

Cross Section of Joiner Frame (10)

MODULAR ENCLOSURE

The present application claims priority from Provisional Patent Application 61/237,816 filed on Aug. 28, 2009.

BACKGROUND

Enclosures are used in a wide variety of applications and industries to house equipment, instrumentation, electronics and a wide variety of other components. The enclosure typically is a convenient means of grouping these components and provides protection from the surrounding environment including water, dirt, dust and other environmental factors which could otherwise harm or destroy the contents. Additionally, enclosures can be used to limit access to the components contained inside.

A limitation of conventional enclosures is the ability to easily expand if the capacity of the enclosure is exceeded. Existing enclosure designs are either stand-alone or are cumbersome to expand and difficult to assemble.

Maintaining a tight seal from the external environment is critical. Existing enclosures typically provide limited seals in the form of a single gasket. This design often leaks and no backup should the gasket fail. Additional, enclosure edges which are typically 90 degrees which limit the use of gaskets on these surfaces. These mating surfaces such as enclosure doors and side covers are therefore not gasketed and can provide areas that can harbor dust, dirt, moisture and insects.

SUMMARY

The modular enclosure described herein provides a flexible means to create enclosures and to in essence expand the enclosure as needed. This is accomplished by creating enclosures with the built in capability to expand in any direction desired. And the design includes the capability to maintain its NEMA rating as it is expanded by adding additional modular enclosure units.

PARTS LIST

Part No. Description
1 Enclosure Frame
2 Enclosure Door
3 Door Hinge
4 Door Latch
5 Door Mounting Bracket
6 Door Swing Bracket
7 Side Cover
8 Attachment Fastener
9 Enclosure Frame Gasket
10 Joiner Frame
11 Divider Plate
12 Sloped Top Cover
13 Flat Top Cover
14 Flat Mounting Panel
15 Tri-Fold Mounting Panel
16 Pedestal Mounting Stand
17 Plinth Mount
18 Concrete Pad Plate
19 Wall Mount
20 Auxiliary Frame
21 Auxiliary Blank Front
22 Auxiliary Keyboard Front
23 Auxiliary Mounting Panel
24 Screw Fastener
25 Mounting Stud
26 Fasteners
27 Auxiliary Front Gasket
28 Joiner Frame Gasket
29 Door Gasket
30 Tapered Edge
31 Flat Surface
32 Relief Edge

DETAILED DESCRIPTION

Figure 1:
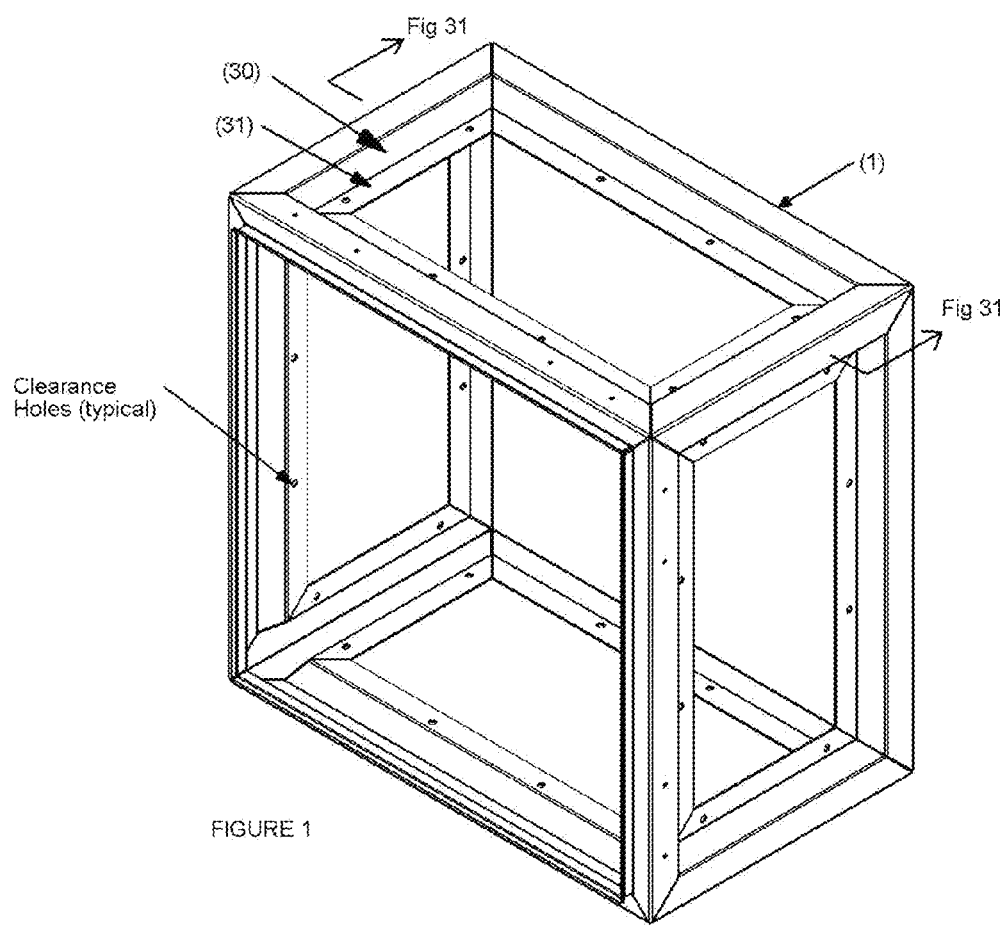
FIG. 1 is a perspective view of the base Enclosure Frame (1). The Enclosure Frame (1) is the main structural member which is the foundation for enclosure assembly and can be outfitted with the Enclosure door (2), Side Covers (5) and other attachments referenced herein.
Figure 31:
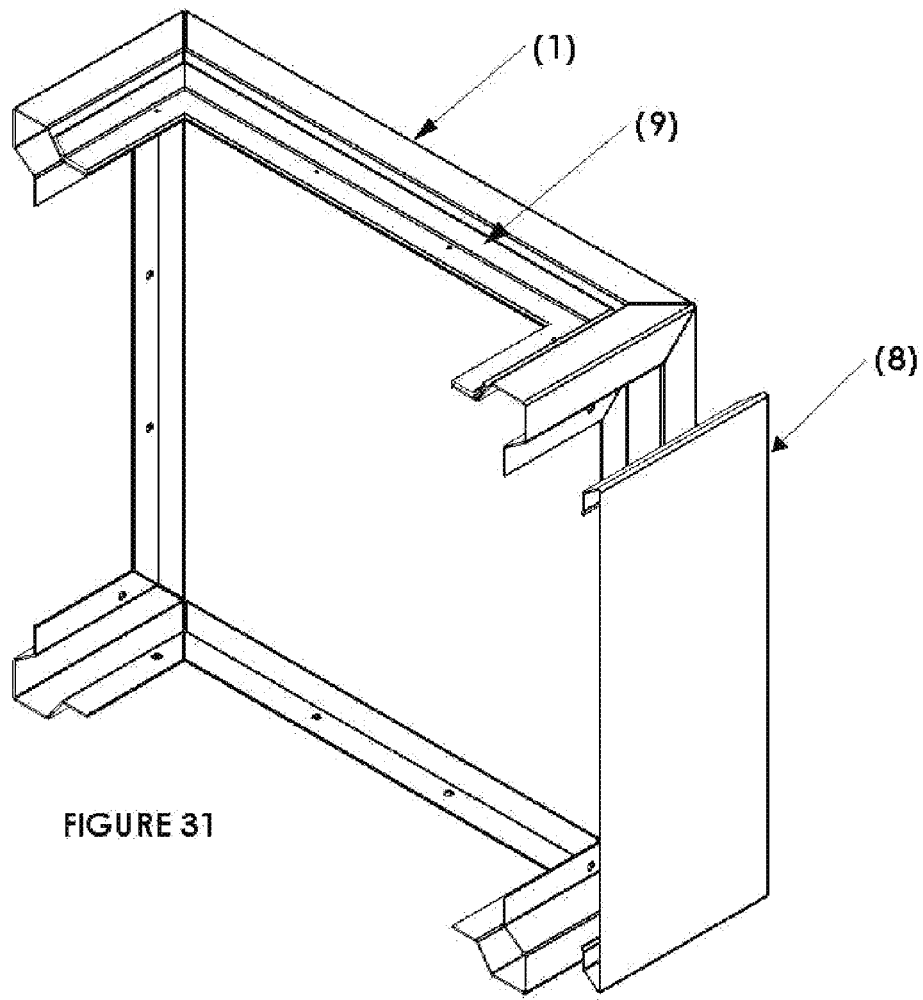
FIG. 31 is a cross-sectional perspective view of the Enclosure Frame (1), Side Cover (7) and Enclosure Frame Gasket (9) in exploded view.
Figure 32:
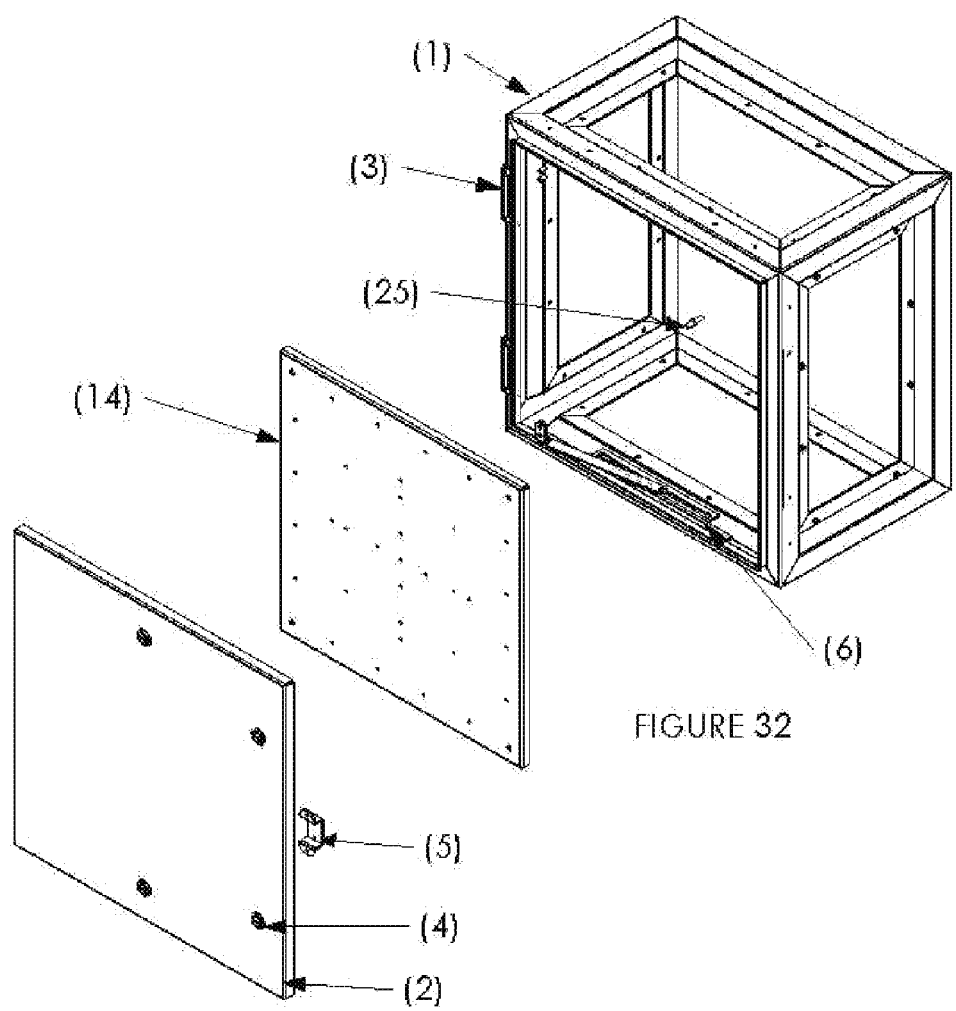
FIG. 32 is a exploded view of the Enclosure Frame (1), the Enclosure door, the Door Hinge (3) mounted to the Enclosure Frame (1), the typical Door Latch (4), the Door Mounting Bracket (5), the Door Swing Bracket (6), Mounting Stud (25) used to mount the Flat Mounting Panel (14), and a Flat Mounting Panel (14)
Figure 33:
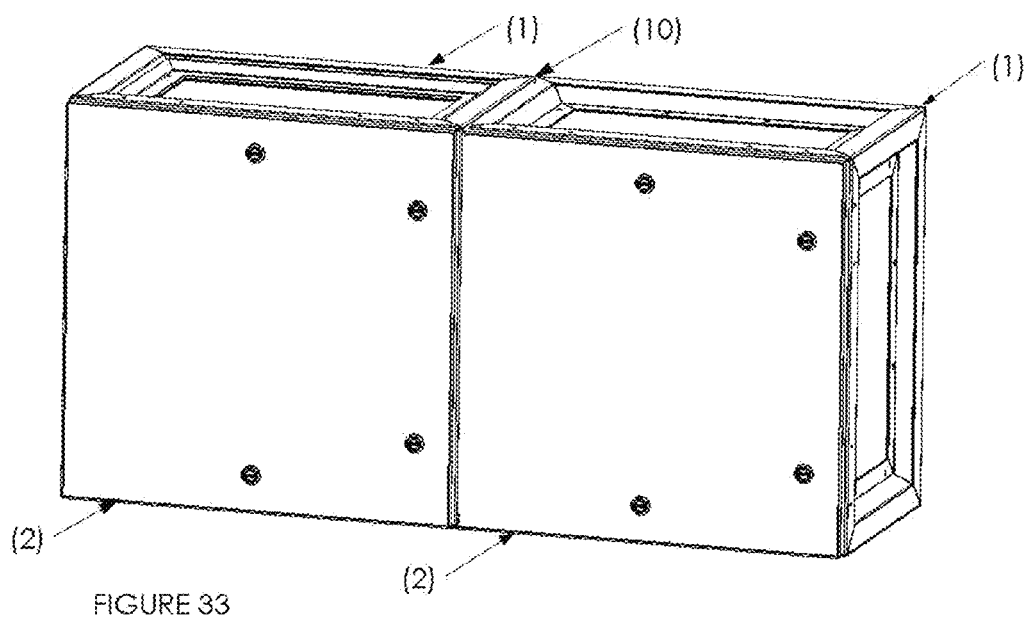
FIG. 33 is a perspective view of a two Enclosure Frame (1) assemblies connected together with a Joiner Frame (10)
Figure 34:
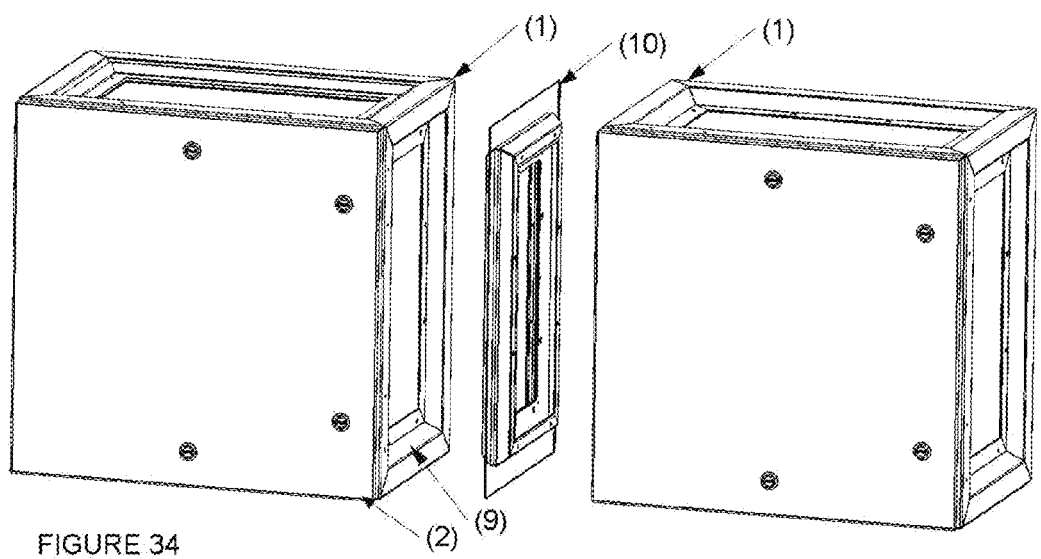
FIG. 34 is a exploded view of a two Enclosure Frame (1) assemblies connected together with a Joiner Frame (10)

The Enclosure Frame (1) illustrated in FIG. 1 is made from steel, typically painted carbon steel or stainless steel, but other materials such as plastic can be used. The Enclosure Frame (1) is one-piece welded or glued construction with an open front to accommodate the Enclosure Door (2) and a solid back surface. The Enclosure Frame (1) illustrated has overall dimensions of 24" High×24" Wide×16" Deep, but the design is not limited to these dimensions and could be larger or smaller than the dimensions presented. All four (4) sides of the Enclosure Frame (1) assembly are open and are identical in size and configuration. The recessed open sides of the Enclosure Frame (1) are gasketed and can accommodate Side Covers (8), Joiner Frames (10), or attachments which include but are not limited to the Sloped Top Cover (12), Flat Top Cover (13), Pedestal Mounting Stand (16), Plenum Mount (17), Concrete Pad Mount (18), or Wall Mount (19) illustrated herein. The recessed open sides of the Enclosure Frame (1) have a unique tapered edge and flat lip as illustrated in FIGS. 31 and 32. This tapered edge and flat lip are typically gasketed and conform to the mating surfaces of the Side Covers (8), Joiner Frames (10), or other attachments. Clearance holes are provided on the inside of the flat lip on the Enclosure Frame (1) side openings. These clearance holes accept screws that are used to mount the Side Covers (8), Joiner Frames (10), or other attachments to the Enclosure Frame (1). The Enclosure Frame Gasket (9) between Enclosure Frame (1) and the Side Covers (8), Joiner Frames (10), or other attachments becomes more compressed as the attachment screws are tightened. The tapered sides allow the Side Covers (8), Joiner Frames (10), or other attachments to be tightly compressed without shearing the gasket material. The tapered sides allow the Side Covers (8), Joiner Frames (10), or other attachments to be tightly compressed without shearing the gasket material. The Enclosure Frame (1) is symmetric along the width (X-axis) and height (Y-axis) which allows the Enclosure Frame (1) to be rotated on the X-Y plane to orient the Door Hinges (4) on either the left side when facing the frame or alternately on the right side, top side or bottom side. Mounting Studs (25) are provided on the interior solid back surface as required to install a variety of mounting panels which include but are not limited to the Flat Mounting Panel (14) or the Tri-fold Mounting Panel (15) which are described and illustrated herein.

Figure 2:
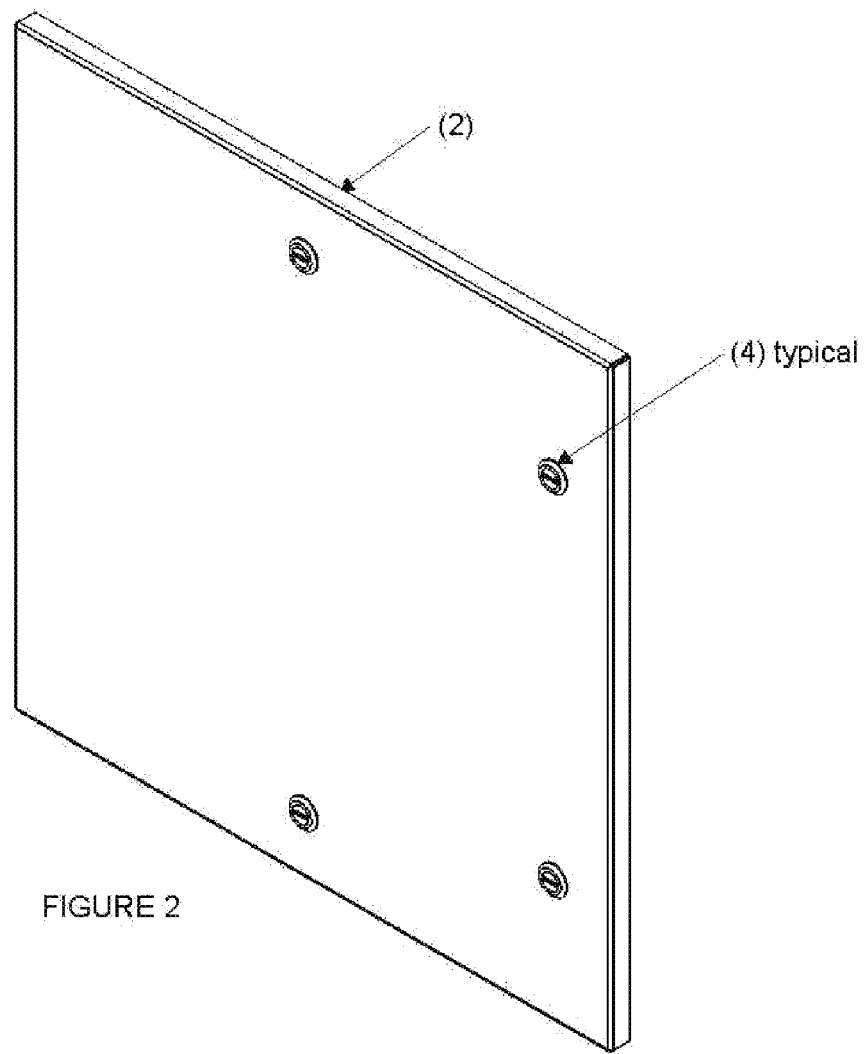
FIG. 2 is a perspective view of the Enclosure Door (2) with the Door Latches (4) attached. The Enclosure Door provides access to the Enclosure Frame (1) interior.

The Enclosure Door (2) illustrated in FIG. 2 is made from steel, typically painted carbon steel or stainless steel, but other materials such as plastic can be used. The Enclosure Door (2) is one-piece welded or glued construction and contains the Door Hinges (3) and one or more Door Latches (4). The Enclosure Door (2) can be oriented as a left hand opening, right hand opening, top opening or bottom opening door depending on the orientation of the Enclosure Frame (1). The door can be quickly and easily removed by removing the Door Hinge pin (3). The door can provides a full 180 degree swing but is limited in opening by the Door Swing Bracket (6). The Enclosure Door (2) contains a Door Gasket (29) on the inside perimeter surface. The Door Gasket (29) provides a water-tight, dust tight seal of between the Enclosure Frame (1) and the Enclosure Door (2).

Figure 3:
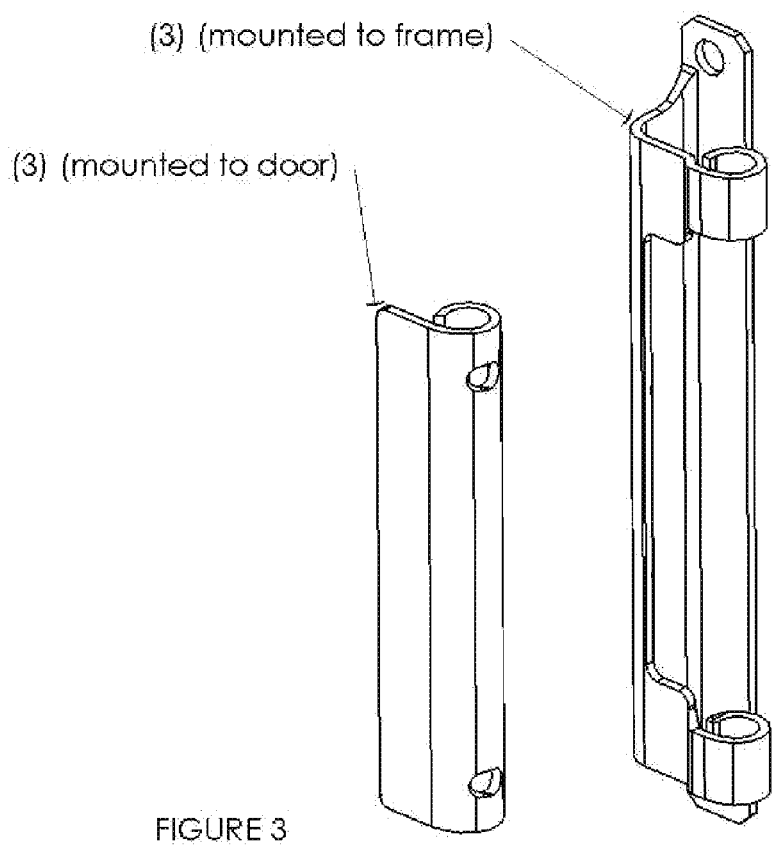
FIG. 3 is a perspective view of a typical door hinge mounted to the Enclosure Frame (1). The Door Hinge (3) consists of both frame side hinge and the mating door side hinge.

The Door Hinges (3) illustrated in FIG. 3 consists of both frame side hinge and pin and the mating door side hinge. The Door Hinge (3) is typical of one of many types of types of commercially available hinges that can be used with the enclosure assembly. The Door Hinge (3) illustrated in FIG. (3) and FIG. (32) contains wrist pins which can be quickly and easily disengaged for quick and easy assembly/disassembly of the door and frame assembly.

Figure 4:
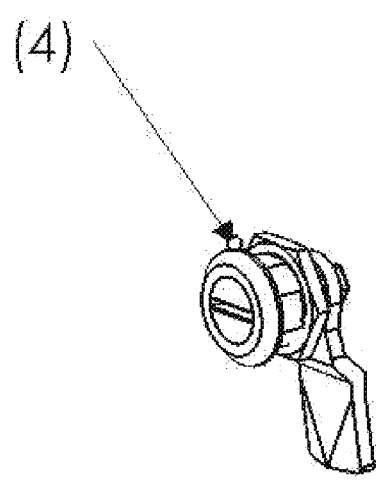
FIG. 4 is a perspective view of a typical Door Latch (4). The Door Latch prevents the Enclosure Door (2) from opening when in the latched position.

The Door Latch (4) illustrated in FIG. 4 is typical of one of many types of types of commercially available door latches that can be used with the enclosure assembly. The Door Latch (4) illustrated in FIG. (4) and in FIGS. (2), (30), (32) and (33) prevents the Enclosure Door (2) from opening when in the latched position. Additionally, the Door Latch (4) pulls the Enclosure Door (2) tightly against the Enclosure Frame (1).

Figure 5:
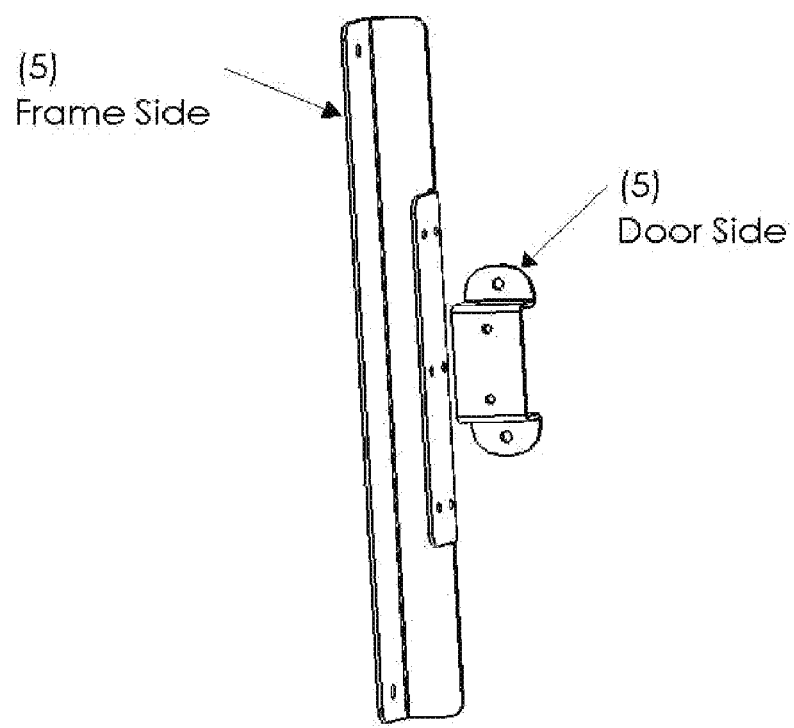
FIG. 5 is a perspective view of the Door Mounting Bracket (5). The Door Mounting Bracket (5) provides a mounting surface for an optional commercially available electronic door interlock.
Figure 6:
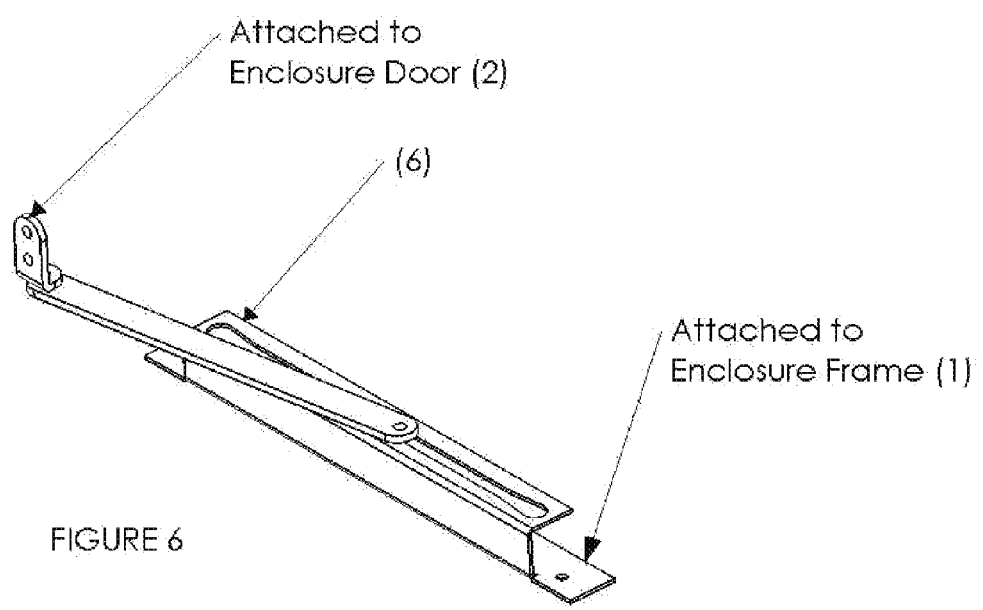
FIG. 6 is a perspective view of the Door Swing Bracket (6). The Door Swing Bracket limits the opening of the Enclosure Door (2) to a set angle.

The Door Mounting Bracket (5) illustrated in FIG. 5 and FIG. (32) consists of two pieces, the Door Mounting Bracket on the Enclosure Frame (1) and the Door Mounting Bracket on the Enclosure Door (2). The Door Mounting Bracket (5) provides a mounting surface for an optional commercially available electronic door interlock. The optional electronic door interlock can be used to prevent the Enclosure Door (2) from being opened. When the electronic door interlock is not engaged, the Enclosure Door (2) can be opened. Likewise, when the electronic door interlock is engaged, the Enclosure Door (2) cannot be opened.

The Door Swing Bracket illustrated in FIG. (6) and FIG. (32) of two pieces, the Door Swing Arm and the Door Swing Slide Bracket. One end of the Door Swing Arm is attached to the Enclosure Door (2) with a fastener. The other end of the Door Swing Arm has a pin which is captive in the Door Swing Slide Bracket. The Door Swing Slide Bracket is attached to the Enclosure Frame with fasteners. The pinned end of the Door Swing Arm can slide in the slot of the Door Swing Slide Bracket until the pin hits the end of the slot thereby limiting the opening of the Enclosure Door (2).

Figure 7:
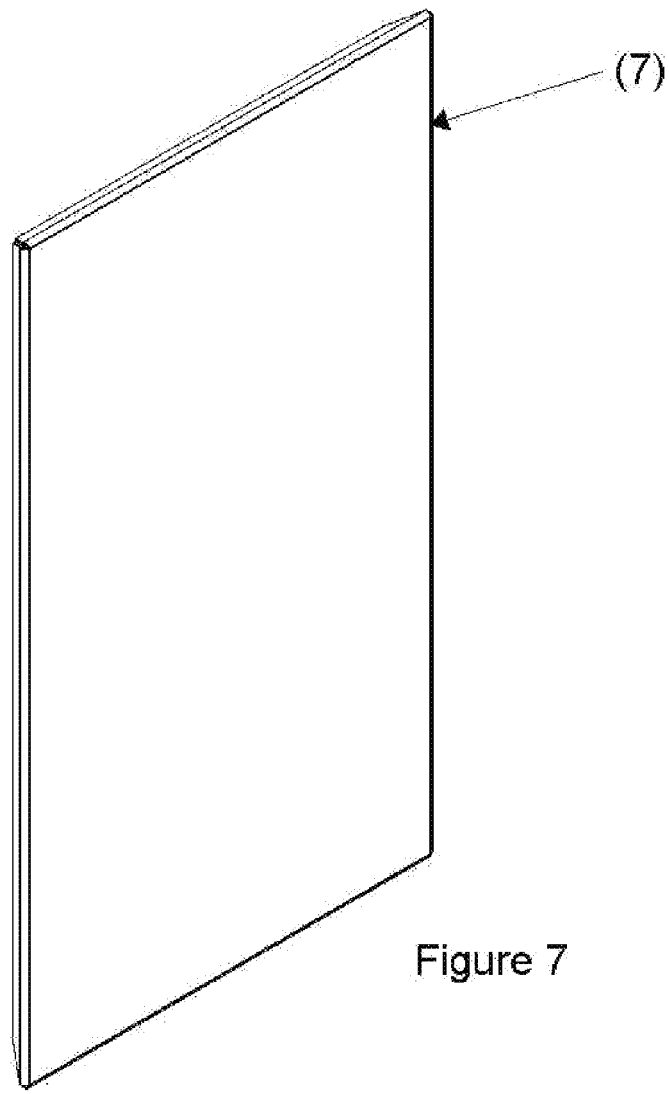
FIG. 7 is a perspective view of the Side Cover (7). The Side Cover (7) fits into any of the four openings of the Enclosure Frame (1) and is used to close off and seal the sides of the enclosure assembly.
Figure 35:
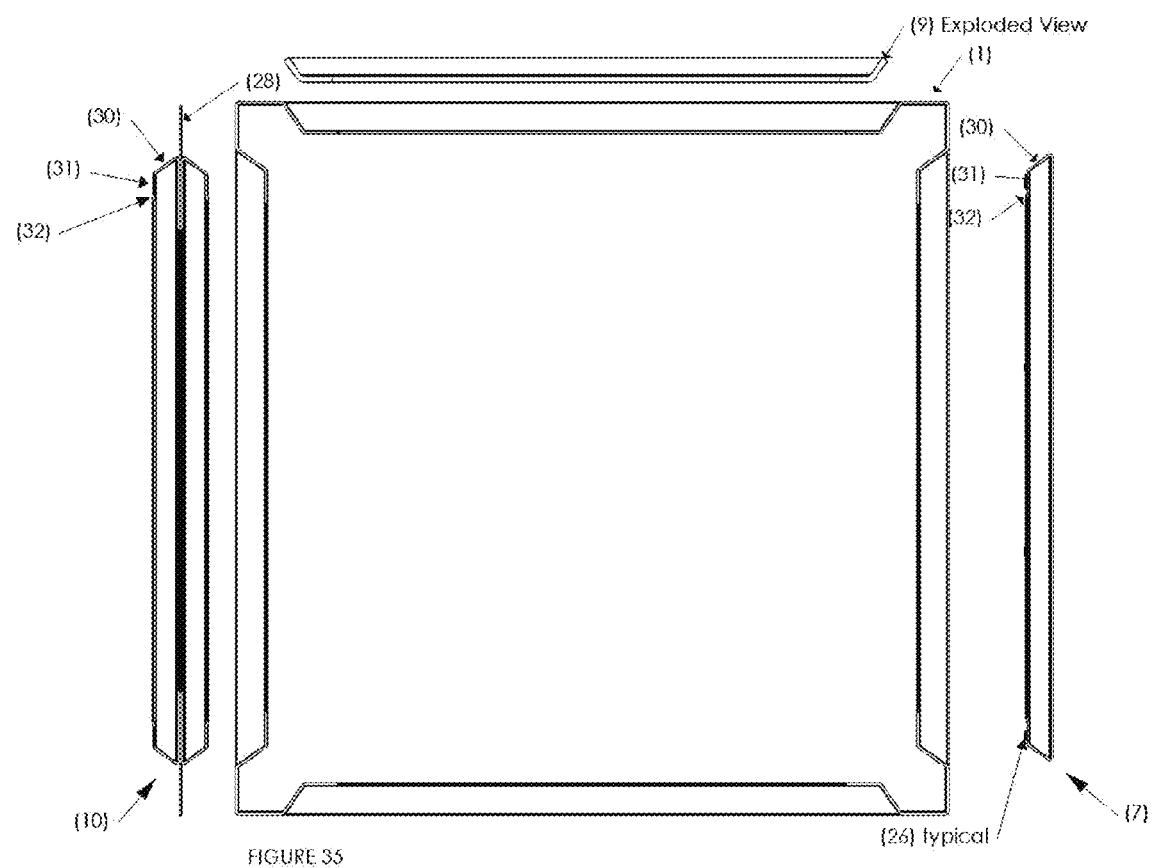
FIG. 35 is a cross sectional view of the Enclosure Frame (1) illustrating the conforming surfaces (30), (31) and (32) of the Enclosure Frame (1) and the Side Cover (7).
Figure 36:
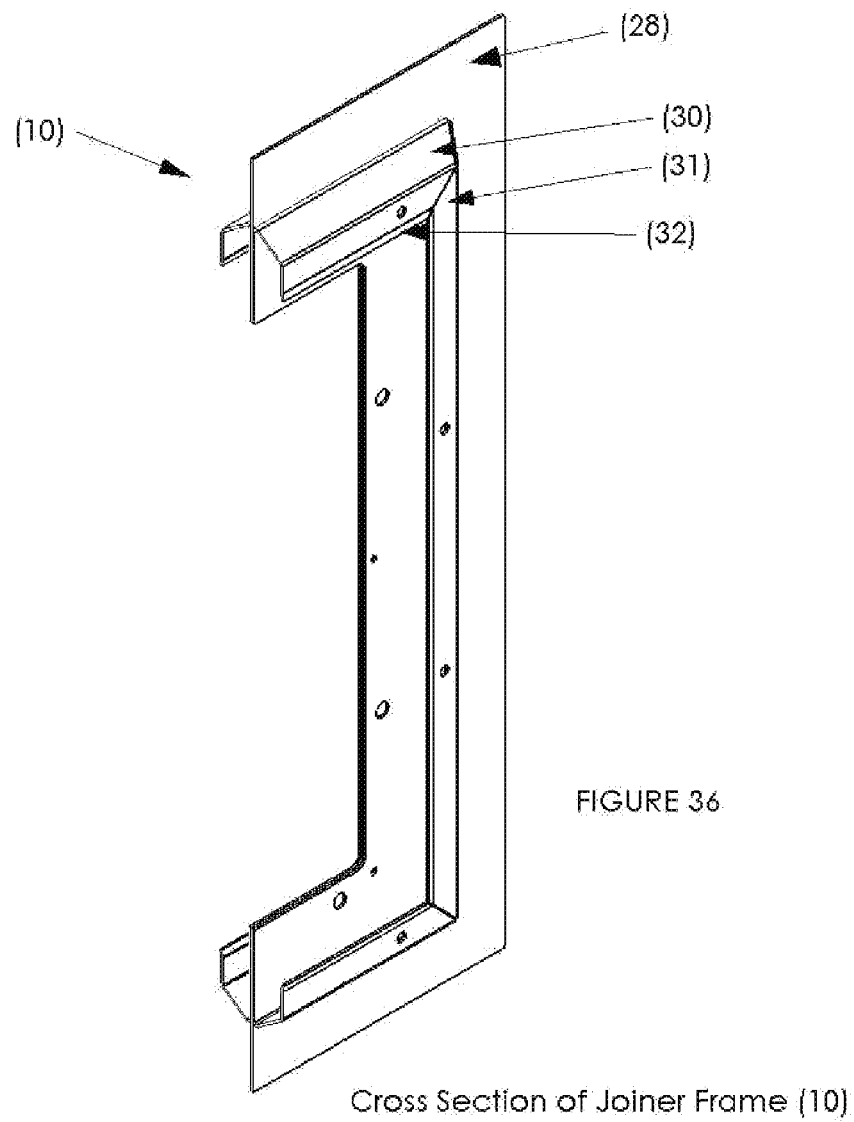
FIG. 36 is a cross sectional view of the Joiner Frame (10) as shown on FIG. 10 illustrating gasketed surface for gasket joiner frame gasket (28) and the conforming surfaces (30), (31) and (32) that mates with Enclosure Frame (1).

The Side Cover (7) illustrated in FIG. 7 is made from steel, typically painted carbon steel or stainless steel, but other materials such as plastic can be used. The Side Cover (7) is one-piece welded or glued construction fits into any of the four openings of the Enclosure Frame (1). The Side Cover (7) has tapered edges followed by a flat inside surface that conform to the angled inside surface and flat surface of the Enclosure Frame (1) side openings. The Side Cover (7) has a slightly angled relief edge on the final inside edge as illustrated in FIG. 35. The Side Cover (7) is attached to the Enclosure Frame (1) with screws or other similar fasteners. When the Side Cover (7) is attached to the Enclosure Frame (1), the mating surfaces consisting of the tapered edges, flat inside surface and the angled relief edge are separated by the Enclosure Frame Gasket (9) which is compressed between the two parts. When installed on the Enclosure Frame (1), the Side Cover (7) provides a flush, water-tight, dust-tight side cover on any of the four Enclosure Frame (1) side cover openings.

Figure 8:
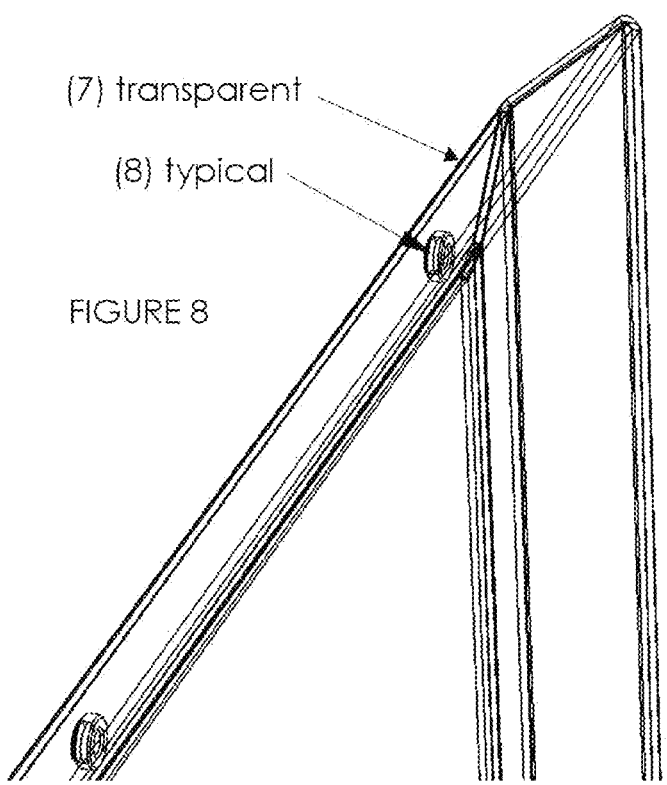
FIG. 8 is a partial perspective view of the Attachment Fastener (8) applied to a Side Cover (7). The Attachment Fasteners (8) are used to attach the Side Covers (8), Joiner Frames (10), or other attachment to the Enclosure Frame (1).
Figure 9:
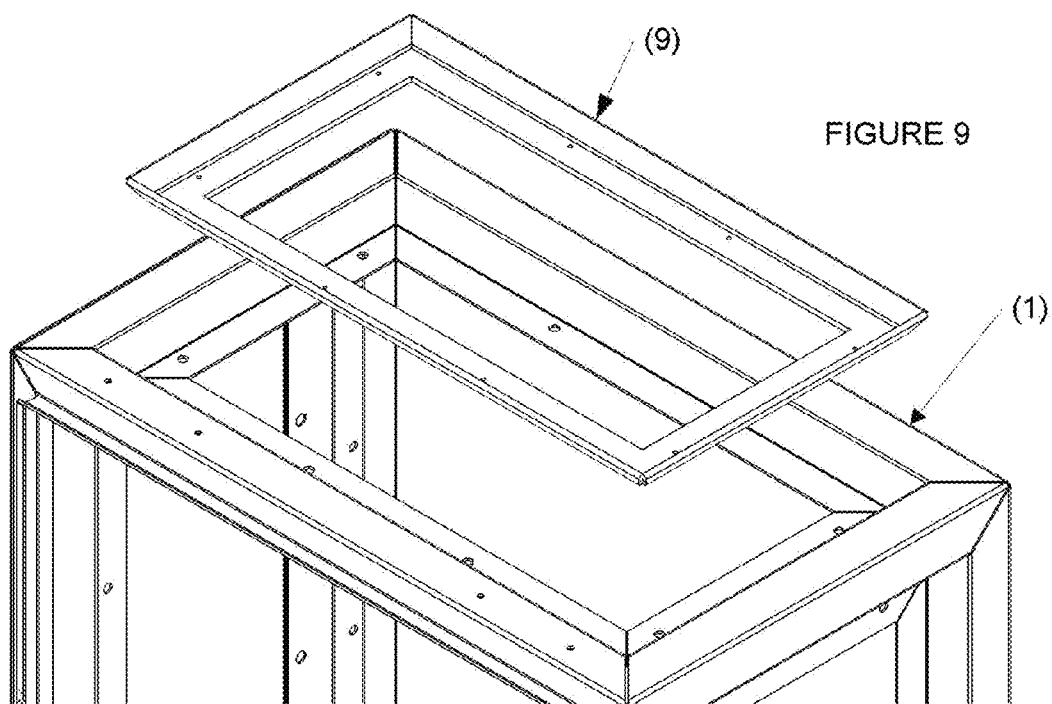
FIG. 9 exploded view of the Enclosure Frame Gasket (9) and Enclosure Frame (1). The Enclosure Frame Gasket (9) is applied to the recessed opening of the Enclosure Frame (1) and provides a tight seal between the frame and the Side Covers (8), Joiner Frames (10), or other attachments.

The Attachment Fastener (8) illustrated in FIG. 8 is a commercially available fastener that is welded or otherwise attached to the inside lip of the Side Cover (7) as illustrated in FIG. (35) and is used when attaching the Side Cover (7) to the Enclosure Frame (1). The Attachment Fastener (8) is threaded and accepts a commercially available attachment screw through clearance holes on the Enclosure Frame (1). The Enclosure Frame Gasket (9) illustrated in FIG. 9 is made from commercially available neoprene or similar elastic water resistant material that is applied with an adhesive to the recessed opening of the Enclosure Frame (1). The Enclosure Frame Gasket (9) is applied to both the tapered edge and flat lip of the Enclosure Frame (1) as illustrated in FIG. 35. The Enclosure Frame Gasket (9) provides a tight seal between the frame and the Side Covers (8), Joiner Frames (10), or other attachments which include but are not limited to the Sloped Top Cover (12), Flat Top Cover (13), Pedestal Mounting Stand (16), Plenum Mount (17), Concrete Pad Mount (18), or Wall Mount (19) illustrated herein.

Figure 10:
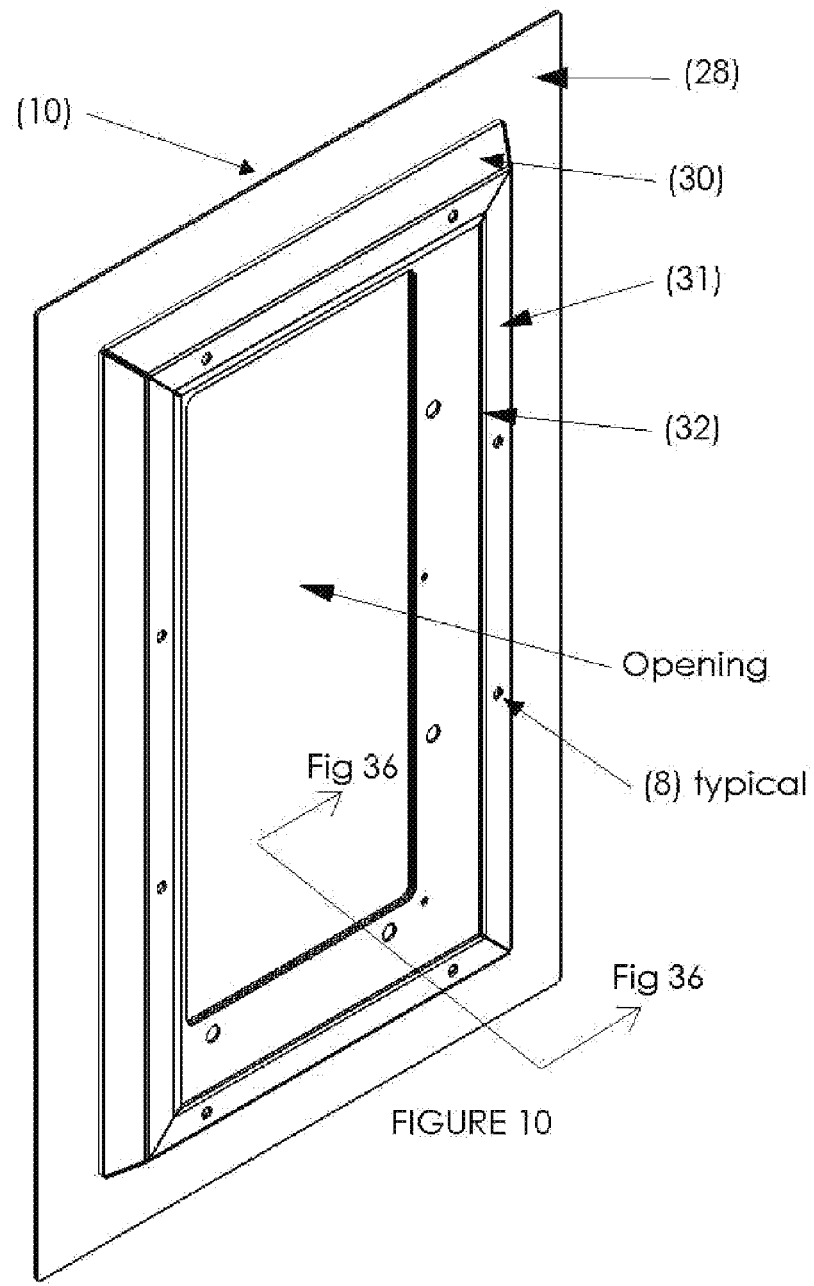
FIG. 10 is a perspective view of the Joiner Frame (10). The Joiner Frame (10) provides a means to quickly and easily connect two or more Enclosure Frames (1) together and can be used to connect other attachments to the Enclosure Frame.

The Joiner Frame (10) illustrated in FIG. 10 is made from steel, typically painted carbon steel or stainless steel, but other materials such as plastic can be used. The Joiner Frame (10) is one-piece welded or glued construction and provides a means to quickly and easily connect two or more Enclosure Frames (1) together and can be used to connect other attachments to the Enclosure Frame. The Joiner Frame (10) provides quick alignment of two mating pieces. The connection of the Joiner Frame (10) to the Enclosure Frame (1) is similar to the Side Cover (7) connection to the Enclosure Frame (1). The Joiner Frame (10) has tapered edges followed by a flat inside surface that conform to the angled inside surface and flat surface of the Enclosure Frame (1) side openings. The Joiner Frame (10) has a slightly angled relief edge on the final inside edge as illustrated in FIG. 35. The Joiner Frame (10) is attached to the Enclosure Frame (1) with screws or other similar fasteners. When the Joiner Frame (10) is attached to the Enclosure Frame (1), the mating surfaces consisting of the tapered edges, flat inside surface and the angled relief edge are separated by the Enclosure Frame Gasket (9) which is compressed between the two parts.

Figure 11:
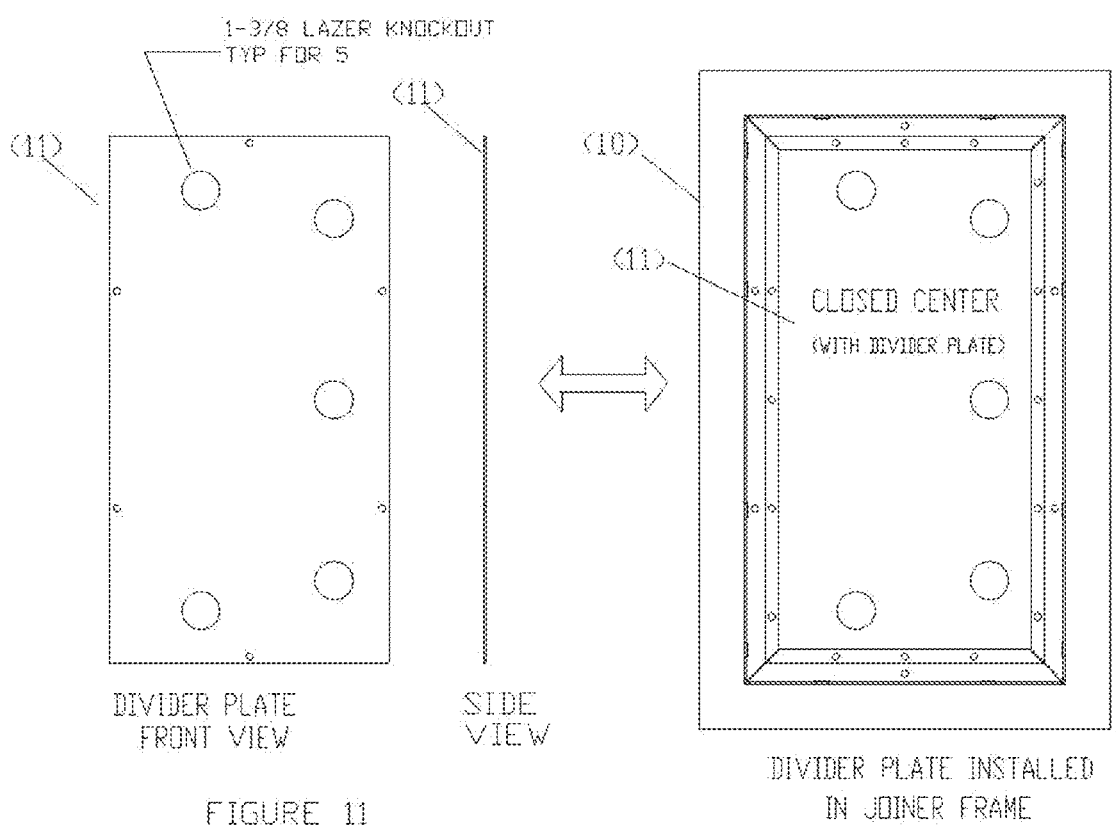
FIG. 11 is a view of the Divider Plate (11) front and side view and view as installed on the Joiner Frame (10). The Divider Plate (11) is installed in the opening of the Joiner Frame (10). When a Joiner Frame is used to connect two (or more enclosures), the divider plate limits access between enclosures.

The Divider Plate (11) illustrated in FIG. 11 is made from steel, typically painted carbon steel or stainless steel, but other materials such as plastic can be used. The Divider Plate (11) is one-piece construction and provides a means to quickly and easily limit access between enclosures when two or more enclosures are connected together. The Divider Plate (11) covers the opening in the Joiner Frame (10) and is attached to the Joiner Frame (1) with Screw Fastener (24) or similar fasteners.

Figure 12:
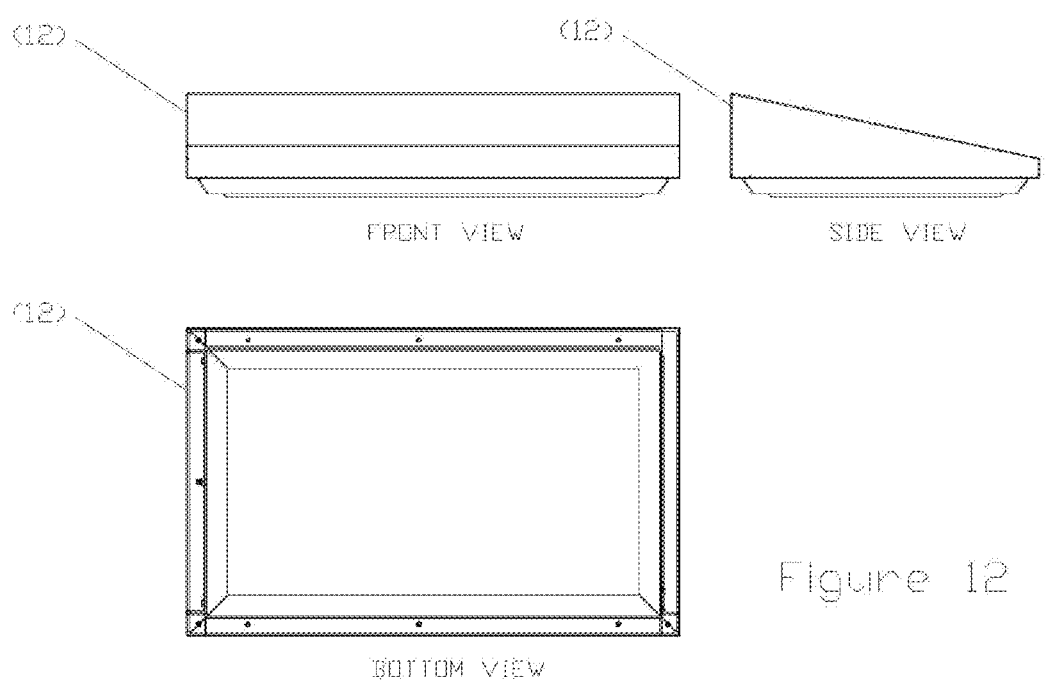
FIG. 12 is a perspective view of the Sloped Top Cover (12). The Sloped Top Cover (12) can be installed on the top of an Enclosure Frame (1) to provide a water-tight sloped top surface that will not retain water.

The Sloped Top Cover (12) illustrated in FIG. 12 is made from steel, typically painted carbon steel or stainless steel, but other materials such as plastic can be used. The Sloped Top Cover (12) is one-piece construction and can be installed on the any of the four openings but is typically installed on the top opening of the Enclosure Frame (1) to provide a water-tight sloped surface that will not retain water. The connection of the Slope Top Cover (12) to the Enclosure Frame (1) is similar to the Side Cover (7) connection to the Enclosure Frame (1). The bottom of the Sloped Top Cover (12) has tapered edges followed by a flat inside surface that conform to the angled inside surface and flat surface of the Enclosure Frame (1) side openings. The Sloped Top Cover (12) has a slightly angled relief edge on the final inside edge as illustrated in FIG. 35. The Sloped Top Cover (12) is attached to the Enclosure Frame (1) with screws or other similar fasteners. When the Sloped Top Cover (12) is attached to the Enclosure Frame (1), the mating surfaces consisting of the tapered edges, flat inside surface and the angled relief edge are separated by the Enclosure Frame Gasket (9) which is compressed by the two parts.

Figure 13:
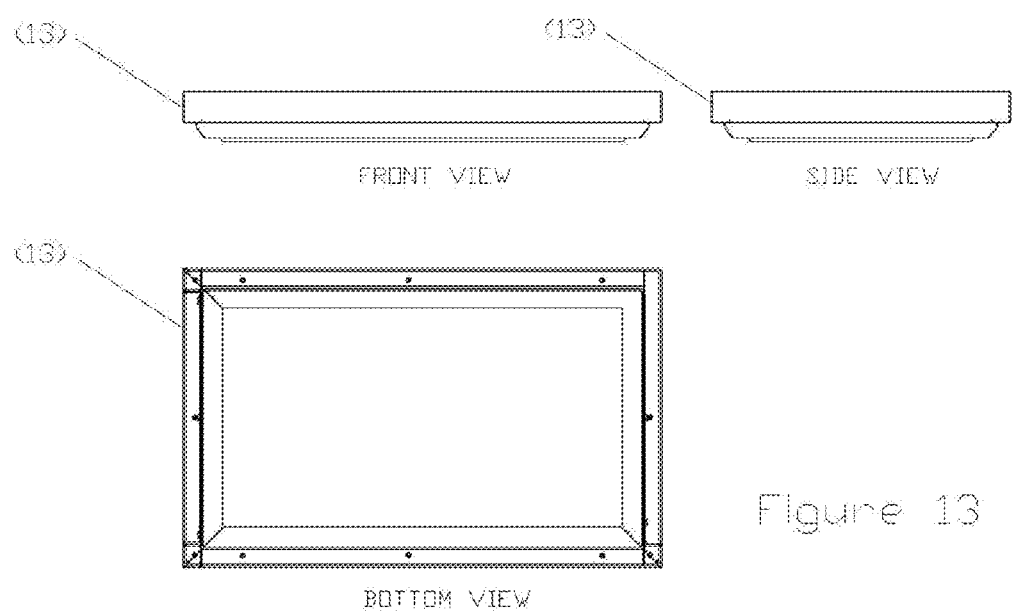
FIG. 13 is a perspective view of the Door Swing Bracket (14).

The Flat Top Cover (13) illustrated in FIG. 13 is made from steel, typically painted carbon steel or stainless steel, but other materials such as plastic can be used. The Flat Top Cover (13) is one-piece construction and can be installed on the any of the four openings but is typically installed on the top opening of the Enclosure Frame (1) to provide a watertight extended flat closure surface. The connection of the Flat Top Cover (13) to the Enclosure Frame (1) is similar to the Side Cover (7) connection to the Enclosure Frame (1). The bottom of the Flat Top Cover (13) has tapered edges followed by a flat inside surface that conform to the angled inside surface and flat surface of the Enclosure Frame (1) side openings. The Flat Top Cover (13) has a slightly angled relief edge on the final inside edge as illustrated in FIG. 35. The Flat Top Cover (13) is attached to the Enclosure Frame (1) with screws or other similar fasteners. When the Flat Top Cover (13) is attached to the Enclosure Frame (1), the mating surfaces consisting of the tapered edges, flat inside surface and the angled relief edge are separated by the Enclosure Frame Gasket (9) which is compressed by the two parts.

Figure 14:
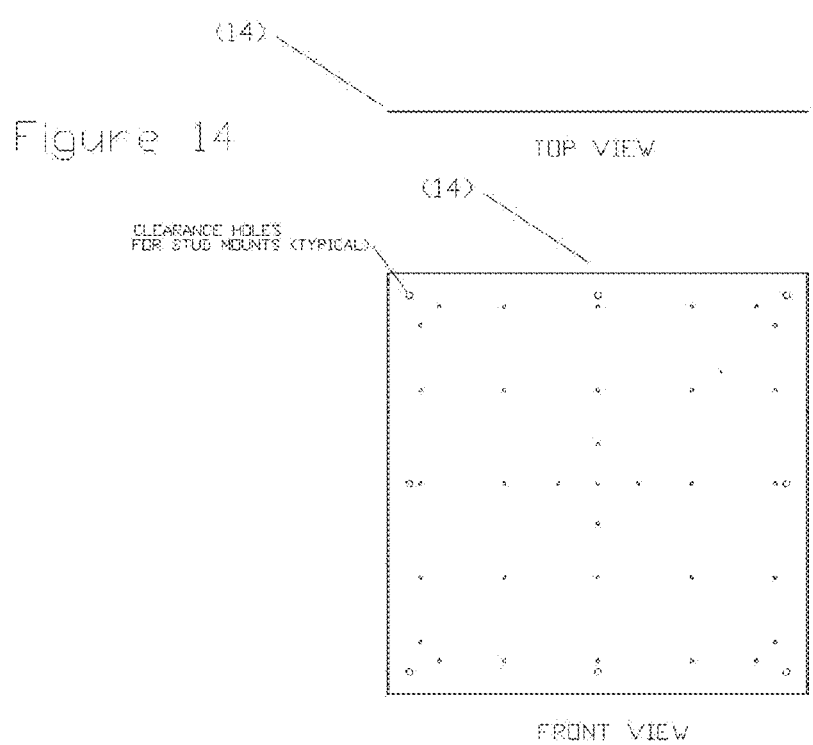
FIG. 14 is a perspective view of the Flat Mounting Panel (14). The Flat Mounting Panel (14) is installed inside the Enclosure Frame (1). The Flat Mounting Panel (14) provides a flat surface on which varies components can be mounted.

The Flat Mounting Panel (14) illustrated in FIG. 14 is made from steel, typically painted carbon steel or stainless steel, but other materials such as plastic can be used. The Flat Mounting Panel (14) is installed inside the Enclosure Frame (1) using the Mounting Studs (25) which are attached to the inside rear solid back surface of the Enclosure Frame (1) as illustrated in FIG. 32. The Flat Mounting Panel (14) provides a flat surface on which varies components such as but not limited to electronic components can be mounted.

Figure 15:
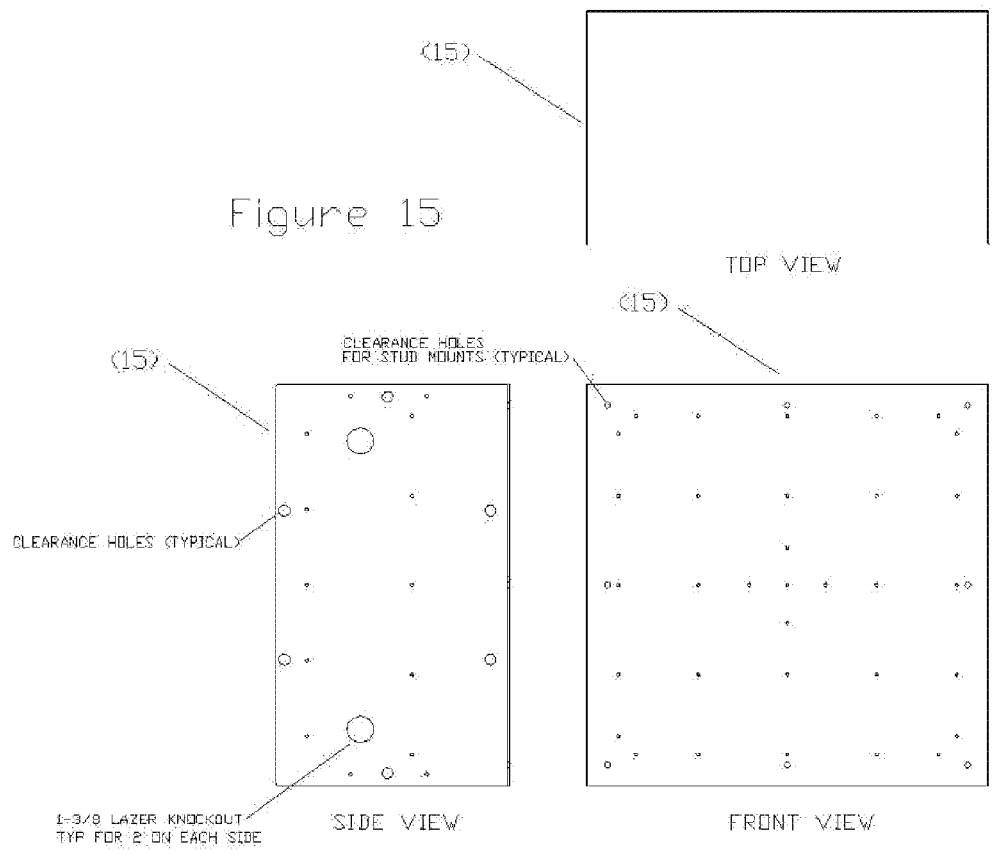
FIG. 15 is a perspective view of the Tri-Fold Mounting Panel (15). The Tri-Fold Mounting Panel (15) is installed inside the Enclosure Frame (1). The Flat Mounting Panel (14) provides three flat surface on which varies components can be mounted.

The Tri-Fold Mounting Panel (15) illustrated in FIG. 15 is made from steel, typically painted carbon steel or stainless steel, but other materials such as plastic can be used. The Flat Mounting Panel (14) is installed inside the Enclosure Frame (1) using the Mounting Studs (25) which are attached to the inside rear solid back surface of the Enclosure Frame (1). The Flat Mounting Panel (14) provides a three flat surfaces on which varies components such as but not limited to electronic components can be mounted. The Tri-Fold Mounting Panel (15) is one-piece construction with multiple surfaces which include the rear surface and one, two, three or four side surfaces. Electronic components can be mounted on any of these surfaces.

Figure 16:
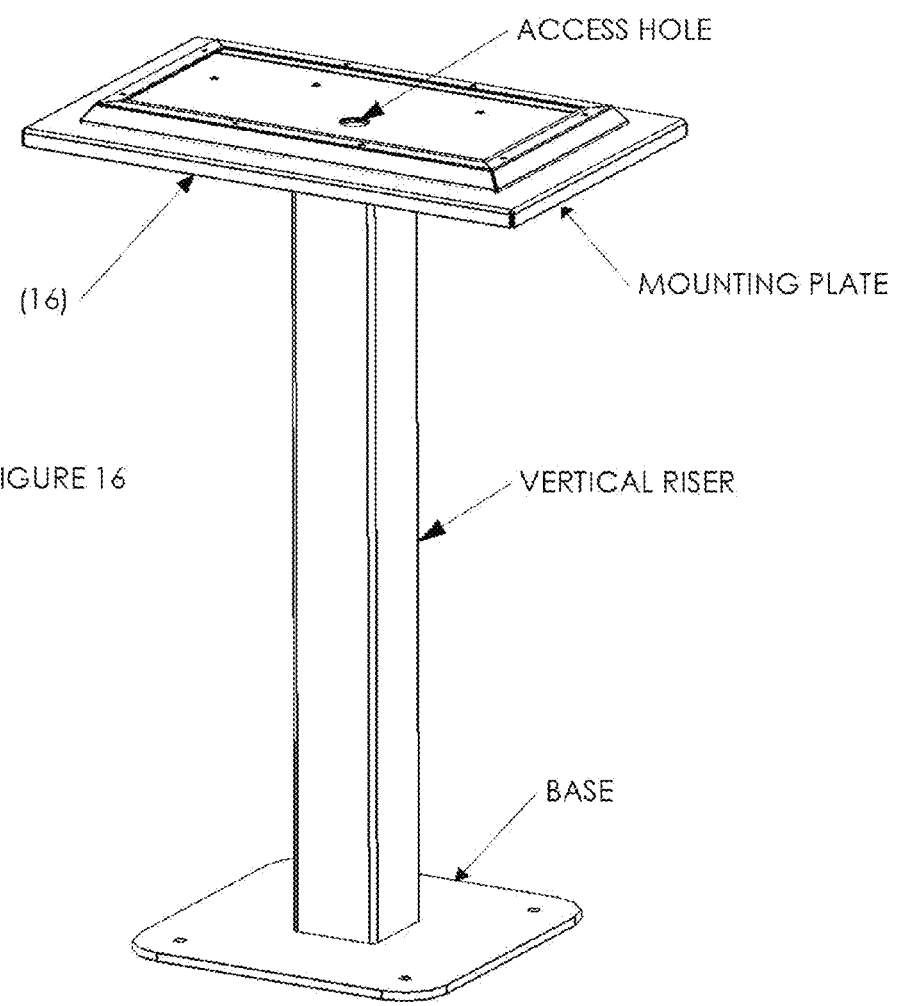
FIG. 16 is a perspective view of the Pedestal Mounting Stand (16). The Pedestal Mounting Stand (16) is a floor mounted base and vertical stand on which the Enclosure Frame (1) or Auxiliary Frame (20) can be mounted.
Figure 30:
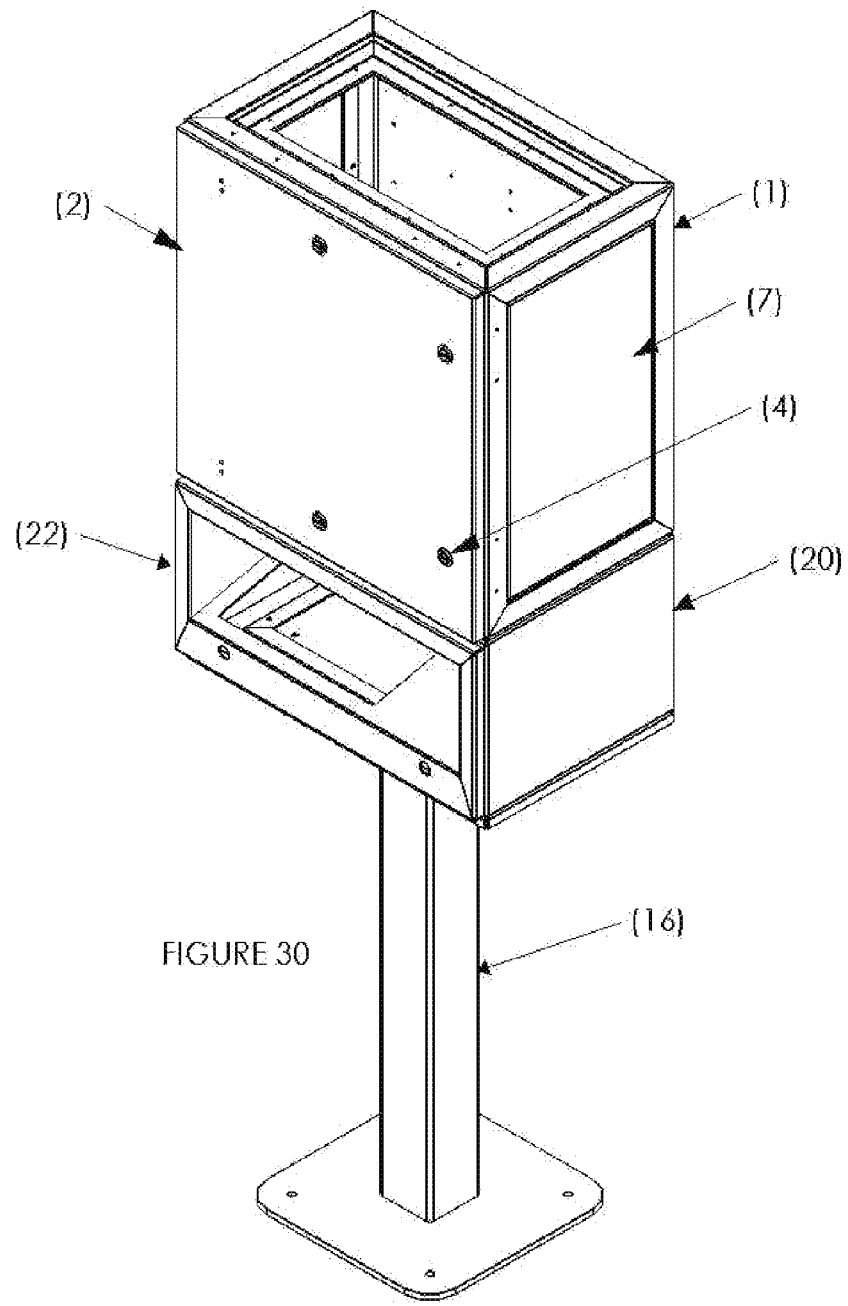
FIG. 30 is perspective view of a partially assembled modular enclosure consisting of an Enclosure Frame (1), an Enclosure door (2) and a single side covers (7), an Auxiliary Frame (20), an Auxiliary Keyboard Front (22), and a Pedestal Mounting Stand (16).

The Pedestal Mounting Stand (16) illustrated in FIG. 16 and FIG. 30 is made from steel, typically painted carbon steel or stainless steel, but other materials such as plastic can be used. The Pedestal Mounting Stand (16) is one-piece welded or glued construction. The Pedestal Mounting Stand (16) is a floor mounted base and vertical riser and mounting plate on which the Enclosure Frame (1) or Auxiliary Frame (20) can be mounted. The base of the Pedestal Mounting Stand (16) is secured to the floor. The top of the Pedestal Mounting Stand (16) has tapered edges followed by a flat inside surface that conform to the angled inside surface and flat surface of the Enclosure Frame (1) side openings. The Pedestal Mounting Stand (16) has a slightly angled relief edge on the final inside edge as illustrated in FIG. 35. The Pedestal Mounting Stand (16) is attached to the Enclosure Frame (1) with screws or other similar fasteners. When the Pedestal Mounting Stand (16) is attached to the Enclosure Frame (1), the mating surfaces consisting of the tapered edges, flat inside surface and the angled relief edge are separated by the Enclosure Frame Gasket (9) which is compressed by the two parts.

Figure 17:
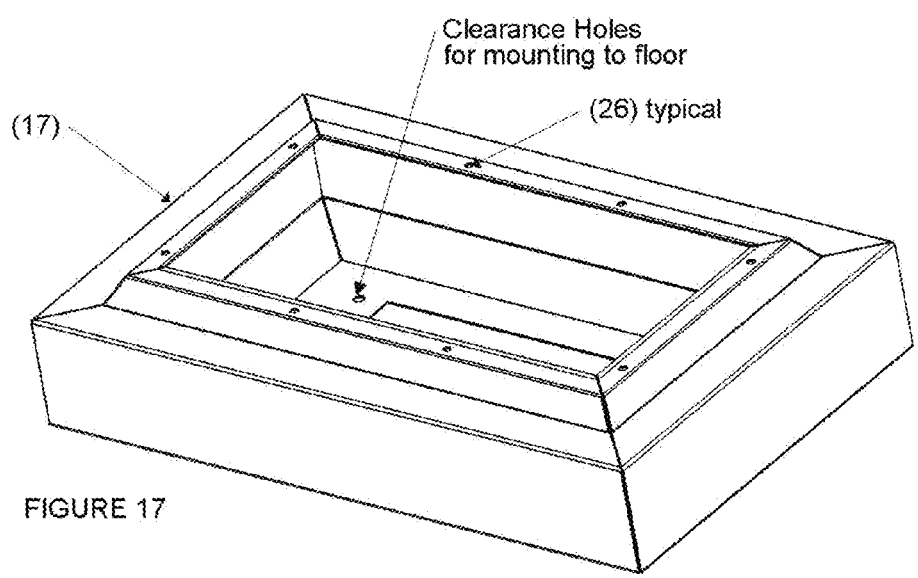
FIG. 17 is a perspective view of the Plinth Mount (17). The Plinth Mount (17) is a floor mounted base on which the Enclosure Frame (1) or Auxiliary Frame (20) can be mounted. The Plinth Mount (17) provides a means for securing and elevating the frame the Enclosure Frame (1) to the floor.

The Plinth Mount (17) illustrated in FIG. 17 is made from steel, typically painted carbon steel or stainless steel, but other materials such as plastic can be used. The Plinth Mount (17) is one-piece welded or glued construction. The Plinth Mount (17) is a floor mounted base on which the Enclosure Frame (1) or Auxiliary Frame (20) can be mounted. The Plinth Mount (17) provides a means for securing and elevating the frame the Enclosure Frame (1) to the floor. The top of the Plinth Mount (17) has tapered edges followed by a flat inside surface that conform to the angled inside surface and flat surface of the Enclosure Frame (1) side openings. The Plinth Mount (17) has a slightly angled relief edge on the final inside edge as illustrated in FIG. 35. The Plinth Mount (17) is attached to the Enclosure Frame (1) with screws or other similar fasteners. When the Plinth Mount (17) is attached to the Enclosure Frame (1), the mating surfaces consisting of the tapered edges, flat inside surface and the angled relief edge are separated by the Enclosure Frame Gasket (9) which is compressed by the two parts.

Figure 18:
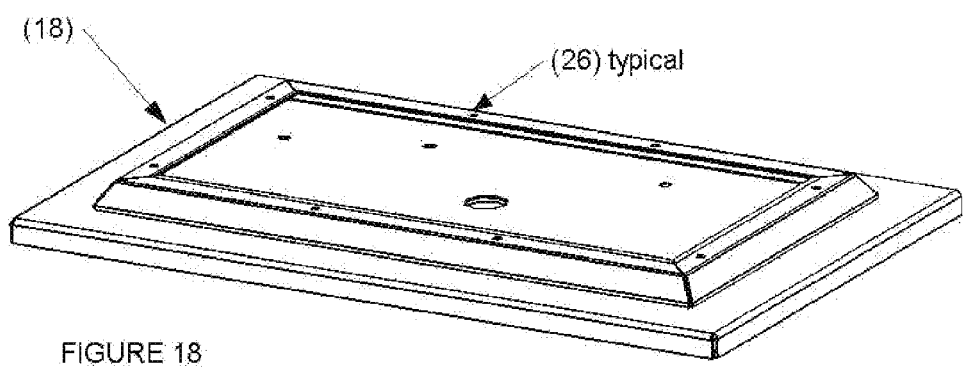
FIG. 18 is a perspective view of the Concrete Pad Plate (18). The Concrete Pad Plate (18) is a floor mounted base on which the Enclosure Frame (1) or Auxiliary Frame (20) can be mounted. The Concrete Pad Plate (18) provides a means for securing the Enclosure Frame (1) flush to the floor.

The Concrete Pad Plate (18) illustrated in FIG. 18 is made from steel, typically painted carbon steel or stainless steel, but other materials such as plastic can be used. The Concrete Pad Plate (18) is one-piece welded or glued construction. The Concrete Pad Plate (18) is a floor mounted base on which the Enclosure Frame (1) or Auxiliary Frame (20) can be mounted. The Concrete Pad Plate (18) is secured to the floor. The top of the Concrete Pad Plate (18) has tapered edges followed by a flat inside surface that conform to the angled inside surface and flat surface of the Enclosure Frame (1) side openings. The Concrete Pad Plate (18) has a slightly angled relief edge on the final inside edge as illustrated in FIG. 35. The Concrete Pad Plate (18) is attached to the Enclosure Frame (1) with screws or other similar fasteners. When the Concrete Pad Plate (18) is attached to the Enclosure Frame (1), the mating surfaces consisting of the tapered edges, flat inside surface and the angled relief edge are separated by the Enclosure Frame Gasket (9) which is compressed by the two parts.

Figure 19:
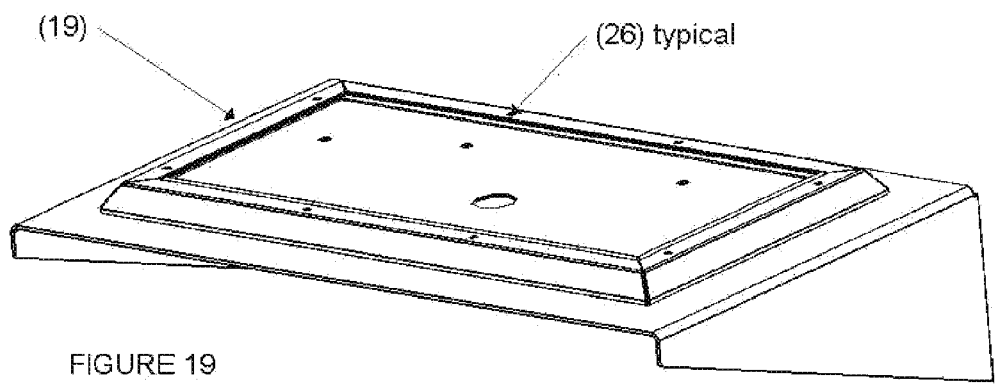
FIG. 19 is a perspective view of the Wall Mount (19). The Wall Mount (19) is typically mounted on a vertical surface on which the Enclosure Frame (1) or Auxiliary Frame (20) can be mounted. The Wall Mount (19) provides a means for securing the Enclosure Frame (1) to a wall or other non-horizontal surface.
Figure 20:
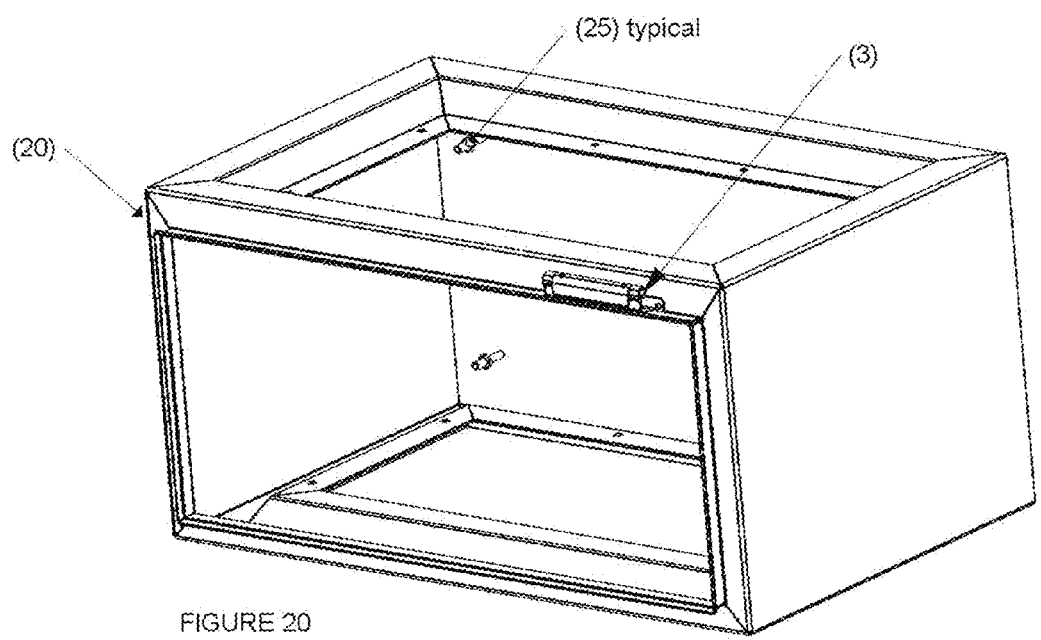
FIG. 20 is a perspective view of the base Auxiliary Frame (1). The Auxiliary Frame (1) is the main structural member which is the foundation for enclosure assembly and can be outfitted with a variety of front panels and other attachments referenced herein.

The Wall Mount (19) illustrated in FIG. 19 is made from steel, typically painted carbon steel or stainless steel, but other materials such as plastic can be used. The Wall Mount (19) is one-piece welded or glued construction. The Wall Mount (19) typically mounted on a vertical surface and provides a means for securing the Enclosure Frame (1) to a wall or other non-horizontal surface. The top of the Wall Mount (19) has tapered edges followed by a flat inside surface that conform to the angled inside surface and flat surface of the Enclosure Frame (1) side openings. The Wall Mount (19) has a slightly angled relief edge on the final inside edge as illustrated in FIG. 35. The Wall Mount (19) is attached to the Enclosure Frame (1) with screws or other similar fasteners. When the Wall Mount (19) is attached to the Enclosure Frame (1), the mating surfaces consisting of the tapered edges, flat inside surface and the angled relief edge are separated by the Enclosure Frame Gasket (9) which is compressed by the two parts.

The Auxiliary Frame (20) illustrated in FIG. (20) and FIG. (30) is made from steel, typically painted carbon steel or stainless steel, but other materials such as plastic can be used. The Auxiliary Frame (20) is one-piece welded or glued construction with an open front to accommodate the Enclosure Door (2) and a solid back surface and side surfaces. The Auxiliary Frame (20) illustrated has overall dimensions of 12" High×24" Wide×16" Deep, but the design is not limited to these dimensions and could be larger or smaller than the dimensions presented. The top and bottom sides of the Auxiliary Frame (20) assembly are open and are identical in size and configuration. The recessed open sides of the Auxiliary Frame (20) are gasketed and can accommodate Side Covers (8), Joiner Frames (10), or attachments which include but are not limited to the Sloped Top Cover (12), Flat Top Cover (13), Pedestal Mounting Stand (16), Plenum Mount (17), Concrete Pad Mount (18), or Wall Mount (19) illustrated herein. The recessed open sides of the Auxiliary Frame (20) have a unique tapered edge and flat lip as illustrated in FIG. (35). This tapered edge and flat lip are typically gasketed and conform to the mating surfaces of the Side Covers (8), Joiner Frames (10), or other attachments. Clearance holes are provided on the inside the flat lip on the Auxiliary Frame (20) side openings. These clearance holes accept screws that are used to mount the Side Covers (8), Joiner Frames (10), or other attachments to the Auxiliary Frame (20). The Enclosure Frame Gasket (9) between Auxiliary Frame (20) and the Side Covers (8), Joiner Frames (10), or other attachments becomes more compressed as the attachment screws are tightened. The tapered sides allow the Side Covers (8), Joiner Frames (10), or other attachments to be tightly compressed without shearing the gasket material. The tapered sides allow the Side Covers (8), Joiner Frames (10), or other attachments to be tightly compressed without shearing the gasket material. Mounting Studs (25) are provided on the interior solid back surface as required to install a variety of mounting panels which include but are not limited to the Auxiliary Frame Flat Mounting Panel (24).

Figure 21:
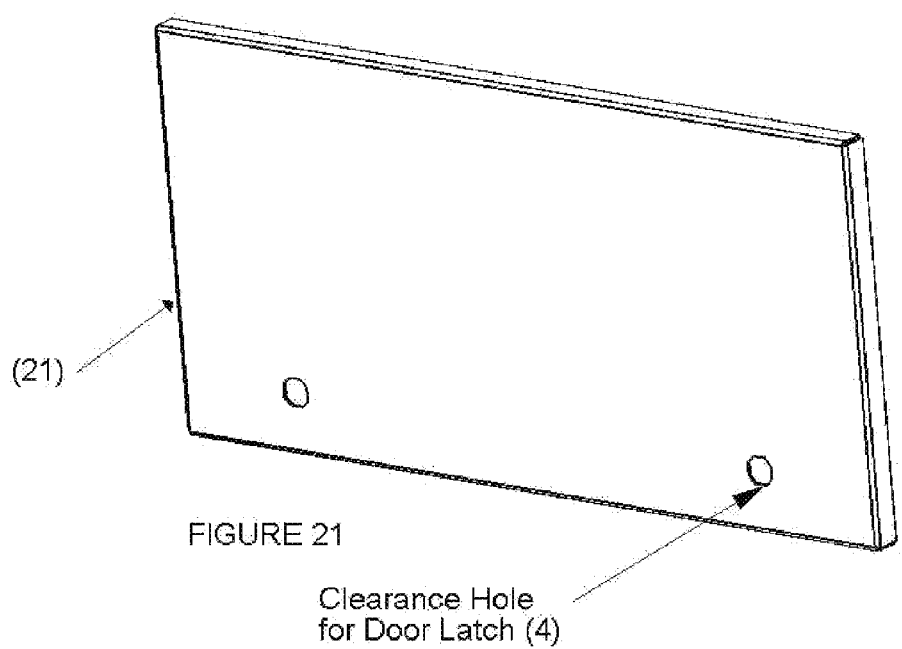
FIG. 21 is a perspective view of the Auxiliary Blank Front (21) with the Door Latches (4) attached. The Auxiliary Blank Front (21) provides access to the Auxiliary Frame (20) interior.

The Auxiliary Blank Front (21) illustrated in FIG. 21 is made from steel, typically painted carbon steel or stainless steel, but other materials such as plastic can be used. The Auxiliary Blank Front (21) is one-piece welded or glued construction and contains the Door Hinges (3) and one or more Door Latches (4). The Auxiliary Blank Front (21) can be oriented as a top opening or bottom opening door depending on the orientation of the Auxiliary Frame (20). The door can be quickly and easily removed by removing the Door Hinge pin (3). The Auxiliary Blank Front (21) contains an Auxiliary Front Gasket (27) on the inside perimeter surface. The Auxiliary Front Gasket (27) provides a water-tight, dust tight seal of between the Auxiliary Frame (20) and the Auxiliary Blank Front (21). The Auxiliary Blank Front (21) has a solid blank front which can be optionally used to mount door components such as but not limited to pushbuttons, pilot lights, or instrumentation.

Figure 22:
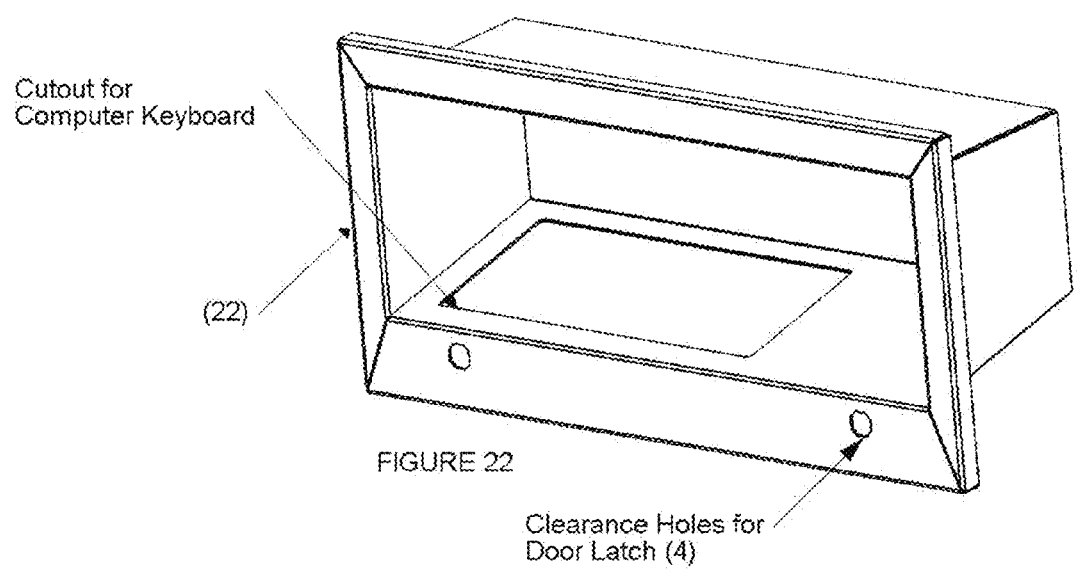
FIG. 22 is a perspective view of the Auxiliary Keyboard Front (22) with the Door Latches (4) attached. The Auxiliary Keyboard Front (22) provides access to the Auxiliary Frame (20) interior.

The Auxiliary Keyboard Front (22) illustrated in FIG. 22 is made from steel, typically painted carbon steel or stainless steel, but other materials such as plastic can be used. The Auxiliary Keyboard Front (22) is one-piece welded or glued construction and contains the Door Hinges (3) and one or more Door Latches (4). The Auxiliary Keyboard Front (22) can be oriented as a top opening or bottom opening door depending on the orientation of the Auxiliary Frame (20). The door can be quickly and easily removed by removing the Door Hinge pin (3). The Auxiliary Keyboard Front (22) contains a Auxiliary Front Gasket (27) on the inside perimeter surface. The Auxiliary Front Gasket (27) provides a water-tight, dust tight seal of between the Auxiliary Frame (20) and the Auxiliary Keyboard Front (22). The Auxiliary Keyboard Front (22) has a recessed surface which can be used to mount a computer keyboard, computer mouse and other components.

Figure 23:
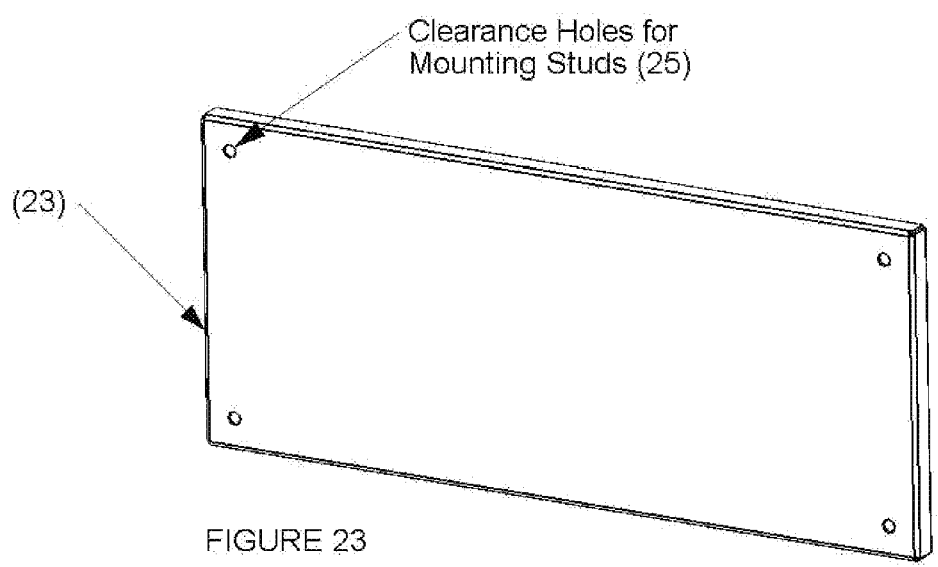
FIG. 23 is a perspective view of the Auxiliary Mounting Panel (23). The Auxiliary Mounting Panel (23) is installed inside the Auxiliary Frame (20). The Auxiliary Mounting Panel (23) provides a flat surface on which varies components can be mounted.

The Auxiliary Mounting Panel (23) illustrated in FIG. 23 is made from steel, typically painted carbon steel or stainless steel, but other materials such as plastic can be used. The Auxiliary Mounting Panel (23) is installed inside the Auxiliary Frame (20) using the Mounting Studs (25) which are attached to the inside rear solid back surface of the Auxiliary Frame (20). The Auxiliary Mounting Panel (23) provides a flat surface on which varies components such as but not limited to electronic components can be mounted.

Figure 24:
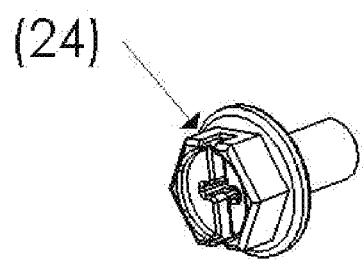
FIG. 24 is a perspective view of a typical Screw Fasteners (24) that is used to attach the Side Covers (8), Joiner Frames (10), or other attachments to the Enclosure Frame (1) or Auxiliary Frame (20).

The Screw Fastener (24) illustrated in FIG. 24 can be a variety of commercially available screw type threaded fasteners. The Screw Fastener (24) is used to attach the Side Covers (8), Joiner Frames (10), Sloped Top Cover (12), Flat Top Cover (13) or other attachments to the Enclosure Frame (1) or Auxiliary Frame (20).

Figure 25:
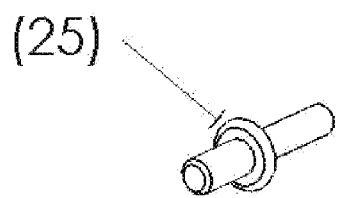
FIG. 25 is a perspective view of a typical Mounting Stud (25) that for mounting the Flat Mounting Panel (14) or Tri-Fold Mounting Panel inside the Enclosure Frame (1). Likewise, the Mounting Stud (25) is used for mounting the Flat Mounting Panel (23) inside the Enclosure Frame (1).

The Mounting Stud (25) illustrated in FIG. 25 can be a variety of commercially threaded stud fasteners. The Mounting Stud (25) is used to mounting the Flat Mounting Panel (14) or Tri-Fold Mounting Panel (15) inside the Enclosure Frame (1). Likewise, the Mounting Stud (25) is used for mounting the Flat Mounting Panel (14) or Tri-Fold Mounting Panel inside the Enclosure Frame (1).

Figure 26:
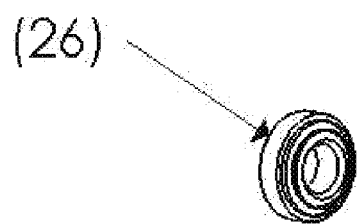
FIG. 26 is a perspective view of a typical Fasteners (26) that is used to attach the Side Covers (8), Joiner Frames (10), or other attachments to the Enclosure Frame (1) or Auxiliary Frame (20).

The Fastener (26) illustrated in FIG. 26 can be a variety of commercially available threaded fasteners. The Fastener (26) is used to attach the Side Covers (8), Joiner Frames (10), Sloped Top Cover (12), Flat Top Cover (13) or other attachments to the Enclosure Frame (1) or Auxiliary Frame (20) using the corresponding Screw Fastener (24).

Figure 27:
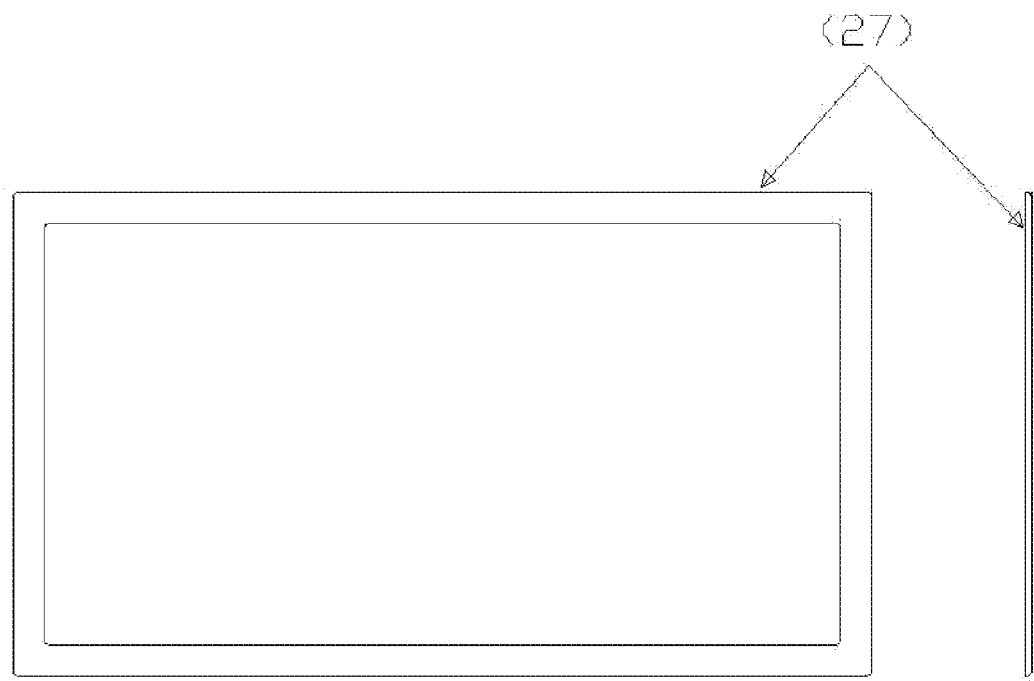
FIG. 27 is view of the Auxiliary Front Gasket (23) which is applied to the inside surface of the Auxiliary Blank Front (21) or Auxiliary Keyboard Front and provides a water-tight, dust-tight seal between the Auxiliary Frame (20) and the Auxiliary Blank Front (21) or Auxiliary Keyboard Front (22).

The Auxiliary Front Gasket (27) illustrated in FIG. 27 is made from commercially available neoprene or similar elastic water resistant material that is applied with an adhesive to the interior surface of the Auxiliary Blank Front (21) or Auxiliary Keyboard Front. The Auxiliary Front Gasket (27) provides a water-tight, dust-tight seal between the Auxiliary Frame (20) and the Auxiliary Blank Front (21) or Auxiliary Keyboard Front (22).

Figure 28:
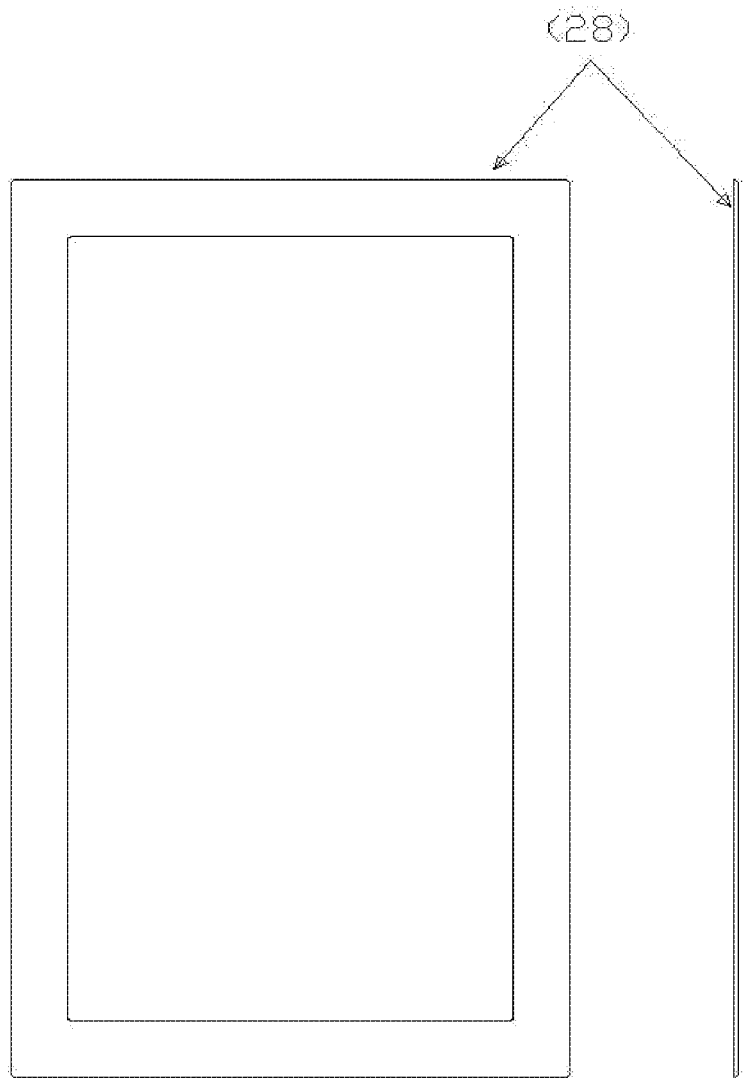
FIG. 28 is view of the Joiner Frame Gasket (23) which is applied to the two side surfaces of the Joiner Frame (10). The Joiner Frame Gasket (23) provides a water-tight, dust-tight seal between two Enclosure Frames (1) when joined together using the Joiner Frame (10).

The Joiner Frame Gasket (28) illustrated in FIG. 28 is made from commercially available neoprene or similar elastic water resistant material that is applied with an adhesive to the applied to the two side surfaces of the Joiner Frame (10). The Joiner Frame Gasket (28) provides a water-tight, dust-tight seal between two Enclosure Frames (1) when joined together using the Joiner Frame (10).

Figure 29:
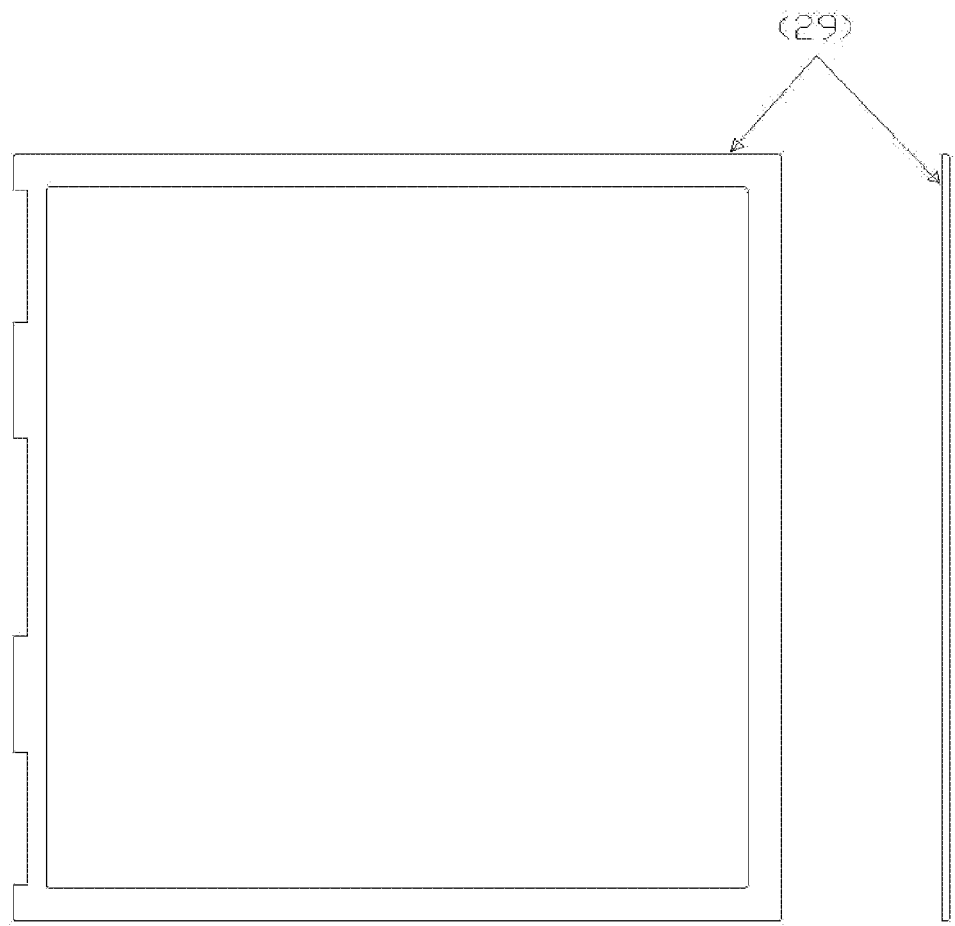
FIG. 29 is view of the Door Gasket (29) which is applied to the inside surface of the Enclosure Door (2) and provides a water-tight, dust-tight seal between the Enclosure Frame (1) and the Enclosure Door (2).

The Door Gasket (29) illustrated in FIG. 29 is made from commercially available neoprene or similar elastic water resistant material that is applied with an adhesive to the interior surface of the Enclosure Door (2). The Door Gasket (29) provides a water-tight, dust-tight seal between the Enclosure Frame (1) and the Enclosure Door (2).

Some of the benefits of this modular enclosure are:

Configurability—Small inventories of parts facilitates interchangeability and provides almost limitless system configurations.

Scalable—Can be used individually or in aggregate to form larger systems.

Enclosures and subcomponents are available in multiple materials for a wide variety of applications. Materials include painted steel, stainless steel and a wide variety of Acrylic plastics.

Standard Designs—Minimizes engineering time and cost from job to job.

Interchangeability—sub-components made of different materials are interchangeable.

Enclosures and corresponding sub-components are water tight NEMA 4 using unique, gasketed joining mechanism. No additional gasketing need be provide after assembly.

Common Joining mechanism—The joining mechanism is standardized for the enclosures and for all sub-components. The joiner frame makes alignment and assembly quick and easy. Additionally, the joiner frame and enclosure frame provide all of the gasketing required to guarantee a water-tight seal between components.

Subpanel design—The subpanel can be configured as needed for a particular intended use. But two basic designs are a flat subpanel and a subpanel with three (3) mounting surfaces (referred to as the tri-fold design). Both subpanels are typically square and can be mounted in any orientation on the mounting studs in the base enclosure frame A square subpanel provides additional flexibility. Components mounted on the subpanel can be installed horizontally or vertically (or upside down) by rotating the subpanel 90 degrees Tri-fold Subpanel design—The tri-fold subpanel has a center mounting surface and two (2) integral side mounting surfaces. The one piece design means that electronics can be completely mounted, wired and tested in place on the bench prior to installing in the enclosure. Conventional methods use 3 individual panels which limit the mounting, wiring and testing that can be done prior to installing the sub-panels in an enclosure.

Tri-fold Subpanel design—The right and left side panels have enlarged holes that allow for clearance for the enclosure frame joiner screws. This means that the base enclosures and/or attachments can be assembled with or without the tri-fold panel installed in the enclosure. Additionally, the same clearance screw holes can be used as attachment points for the tri-fold subpanel to the enclosure frame by using the same assembly screws with flat washers.

Tri-fold Subpanel design—Additionally, the tri-fold panels can be pre-drilled from manufacturing for mounting of din rail and wire cover. This reduces assembly time and cost in the shop.

Safety—The modular design permits segregation of low from high voltage by installing a "divider plate" between enclosure compartments. Likewise free access between enclosures can be accomplished by removing the "divider plate".

Watertight/Dust Tight Seal Design—Enclosure sides, accessories and joining mechanism use a unique, watertight design which prevents penetration of water or foreign materials from entering enclosure.

It is obvious that the above described invention has unlimited number of variations. The size and shape of the enclosure, the number of sides, the size and shape of the side openings, the configuration of mounting plates within the enclosure, the material of each part of the enclosure, can all be selected based on the particular intended use of the enclosure. It is recognized that departures from the disclosed embodiments may be made within the scope of this invention and that obvious modification will occur to a person skilled in the art.

I claim:

1. A modular enclosure frame comprising:
an open front;
a solid rear surface;
at least one open side wherein the opening in the side is formed by a tapered edge extending from outer surface of the enclosure frame inward toward center of the enclosure frame with the tapered edge ending with a flat lip which is essentially parallel to the outer surface;
wherein multiple enclosure frames are assembled together by fastening adjacent enclosures to opposite sides of a joiner frame wherein a front and a back of the joiner frame each have tapered edges extending away from the joiner frame and followed by a flat inside surface that conforms to the angled inside surface and flat surface of the enclosure frame side openings.

2. A modular enclosure frame according to claim 1 further comprising a door mounted on the open front of the enclosure frame.

3. A modular enclosure frame according to claim 1 further comprising a gasket on the door.

4. A modular enclosure frame according to claim 1 further comprising an enclosure frame gasket which is designed and created with a tapered edge and flat lip and installed in the opening in the side of the enclosure frame.

5. A modular closure according to claim 4 wherein the enclosure is fastened to a pedestal mounting stand comprising a base, a vertical riser attached to the base, and a mounting plate attached to the top of the riser wherein the top of the mounting has tapered edges extending away from the top of the mounting plate followed by a flat inside surface that conforms to the angled inside surface and flat surface of the enclosure frame side openings.

6. A modular closure according to claim 4 wherein the enclosure is fastened to a plinth mount wherein a top of the plinth mount has tapered edges extending away from the top of the plinth mount followed by a flat inside surface that conforms to the angled inside surface and flat surface of the enclosure frame side openings.

7. A modular closure according to claim 4 wherein the enclosure frame is fastened to a concrete pad plate wherein a top of the concrete pad plate has tapered edges extending away from the top of the concrete pad plate followed by a flat inside surface that conforms to the angled inside surface and flat surface of the enclosure frame side openings.

8. A modular closure according to claim 4 wherein the enclosure is fastened to a wall mount wherein a top of the wall mount has tapered edges extending away from the top of the wall mount followed by a flat inside surface that conforms to the angled inside surface and flat surface of the enclosure frame side openings.

9. A modular enclosure frame according to claim 1 further comprising a joiner frame gasket.

10. A modular enclosure frame according to claim 9 wherein the joiner frame has a slightly angled relief edge on its final inside edge.

11. Modular enclosure frame according to claim 10 further comprising a divider plate fastened to the joiner frame and covering the opening in the joiner frame.

12. A modular enclosure frame according to claim 10 wherein the side cover has a slightly angled relief edge on its final inside edge.

13. A modular closure frame according to claim 1 further comprising a side cover wherein the side cover has a top and a bottom with tapered edges extending away from the bottom of the side cover followed by a flat inside surface that conforms to the angled inside surface and flat surface of the enclosure frame side openings.

14. A modular enclosure frame according to claim 1 further comprising a top cover wherein the top of the top cover has a slope extending from one side to an opposite side and the bottom of the top cover has tapered edges extending away from the top cover followed by a flat inside surface that conform to the angled inside surface and flat surface of the enclosure frame side openings.

15. A modular enclosure frame according to claim 1 further comprising a flat mounting panel fastened to the solid rear surface of the enclosure frame.

16. A modular enclosure frame according to claim 1 further comprising a tri-fold mounting panel fastened to the solid rear surface of the enclosure frame.

17. A modular enclosure frame according to claim 1 wherein the enclosure frame is metal.

18. A modular enclosure frame according to claim 17 wherein multiple enclosure frames are assembled together by fastening adjacent enclosures to opposite sides of a joiner frame wherein a front and a back of the joiner frame each have tapered edges extending away from the joiner frame and followed by a flat inside surface that conforms to the angled inside surface and flat surface of the enclosure frame side openings.

19. A modular enclosure frame according to claim 1 wherein multiple enclosure frames are assembled together by fastening adjacent enclosures to opposite sides of a joiner frame wherein a front and a back of the joiner frame each have tapered edges extending away from the joiner frame and followed by a flat inside surface that conforms to the angled inside surface and flat surface of the enclosure frame side openings.

* * * * *